United States Patent
Murata et al.

(10) Patent No.: US 9,064,912 B2
(45) Date of Patent: Jun. 23, 2015

(54) HEATING DEVICE, SUBSTRATE PROCESSING APPARATUS, AND METHOD OF MANUFACTURING SEMICONDUCTOR DEVICE

(75) Inventors: Hitoshi Murata, Toyama (JP); Tetsuya Kosugi, Toyama (JP); Shinobu Sugiura, Toyama (JP); Masaaki Ueno, Toyama (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 34 days.

(21) Appl. No.: 12/838,831

(22) Filed: Jul. 19, 2010

(65) Prior Publication Data

US 2011/0021039 A1    Jan. 27, 2011

Related U.S. Application Data

(63) Continuation-in-part of application No. 12/748,920, filed on Mar. 29, 2010.

(30) Foreign Application Priority Data

Jul. 21, 2009   (JP) ................................. 2009-169938
Jun. 25, 2010  (JP) ................................. 2010-145457

(51) Int. Cl.
*H05B 3/02*   (2006.01)
*H05B 3/06*   (2006.01)
(Continued)

(52) U.S. Cl.
CPC ................................ *H01L 21/67109* (2013.01)

(58) Field of Classification Search
CPC ............ H05B 3/66; H05B 3/62; C30B 15/14; H01L 21/67098; H01L 21/67115; F27B 17/0025; F27B 11/02

USPC ......... 219/548, 552, 553, 390, 405; 392/416, 392/407

See application file for complete search history.

(56) References Cited

U.S. PATENT DOCUMENTS 4,088,825 A * 5/1978 Carr ............................ 373/130
5,171,972 A * 12/1992 Hidano ...................... 219/390
(Continued)

FOREIGN PATENT DOCUMENTS

CN    1941287 A    4/2007
JP    53144544     12/1978
(Continued)

OTHER PUBLICATIONS

Japanese Foreign Office Action, date Dec. 17, 2014, 11 pages.

*Primary Examiner* — Bradley K Smith
*Assistant Examiner* — David Goodwin
(74) *Attorney, Agent, or Firm* — Brundidge & Stanger, P.C.

(57) ABSTRACT

A heating device includes: a heating element including a mountain part and a valley part alternately connected in plurality to form a meander shape, and a holding body receiving part an end of the valley part, where a width of the holding body receiving part is greater than that of the valley part; an insulating body installed at an outer circumference of the heating element with both ends of the heating element fixed thereto; and a staple pin penetrating the holding body receiving part and a neighboring holdings body receiving part to fix the heating element to the insulating body, where the staple pin is dislocated with respect to a center of the holding body receiving part and an amount of dislocation of the staple pin varies according to a distance between the holding body receiving part and the both ends.

11 Claims, 23 Drawing Sheets

(51) Int. Cl.
*H01L 21/26* (2006.01)
*H01L 21/67* (2006.01)

(56) References Cited

U.S. PATENT DOCUMENTS

| | | | | |
|---|---|---|---|---|
| 5,187,771 A | * | 2/1993 | Uchida | 392/416 |
| 5,507,639 A | * | 4/1996 | Monoe | 432/77 |
| 5,911,825 A | * | 6/1999 | Groat et al. | 117/200 |
| 8,023,806 B2 | * | 9/2011 | Ichikawa et al. | 392/416 |
| 2008/0205864 A1 | * | 8/2008 | Kobayashi et al. | 392/416 |
| 2010/0193505 A1 | * | 8/2010 | Peck | 219/548 |

FOREIGN PATENT DOCUMENTS

| | | |
|---|---|---|
| JP | 61134271 | 6/1986 |
| JP | H03031296 U | 3/1991 |
| JP | 4-318923 | 11/1992 |
| JP | 2001126847 | 5/2001 |
| JP | 2006100755 | 4/2006 |
| JP | 2007-88325 | 4/2007 |
| JP | 2008218478 | 9/2008 |
| JP | 2008243820 A | 10/2008 |
| JP | 2008263170 | 10/2008 |
| JP | 2011023685 A | 2/2011 |
| JP | 2012009702 A | 1/2012 |

* cited by examiner

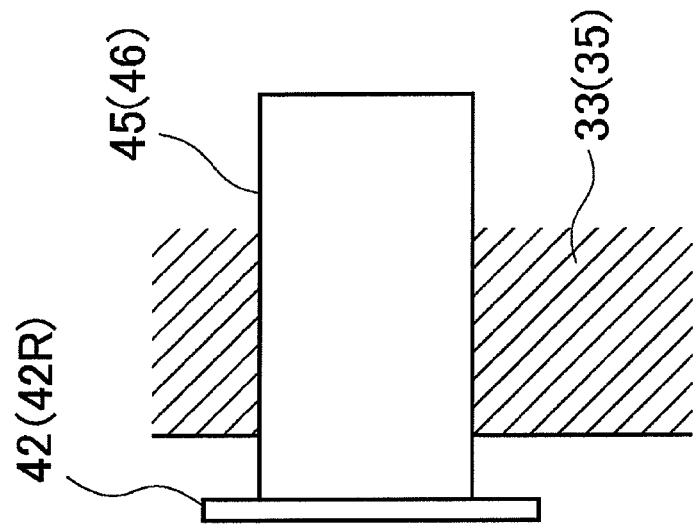
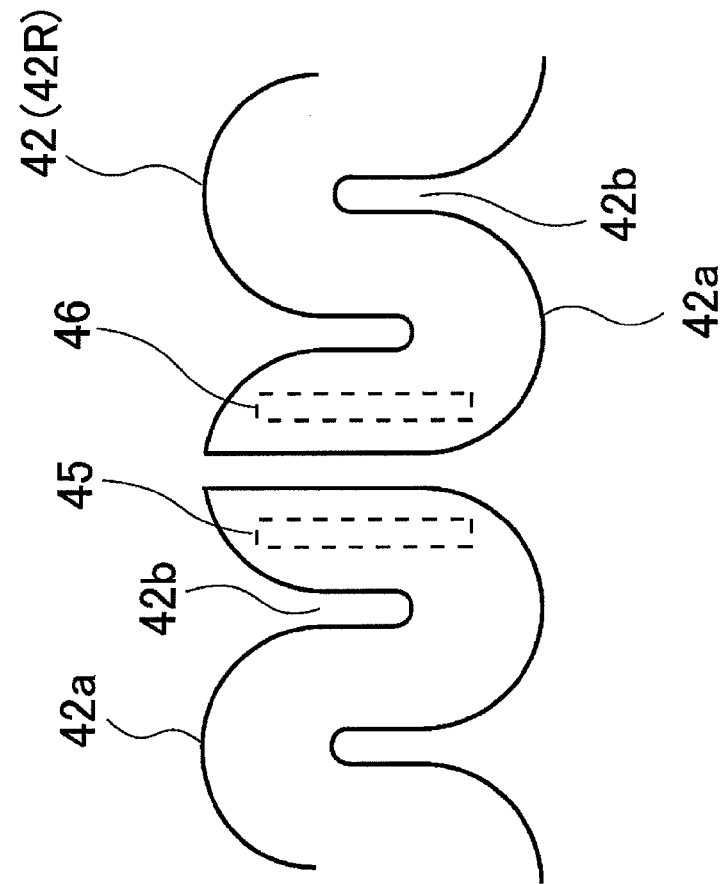

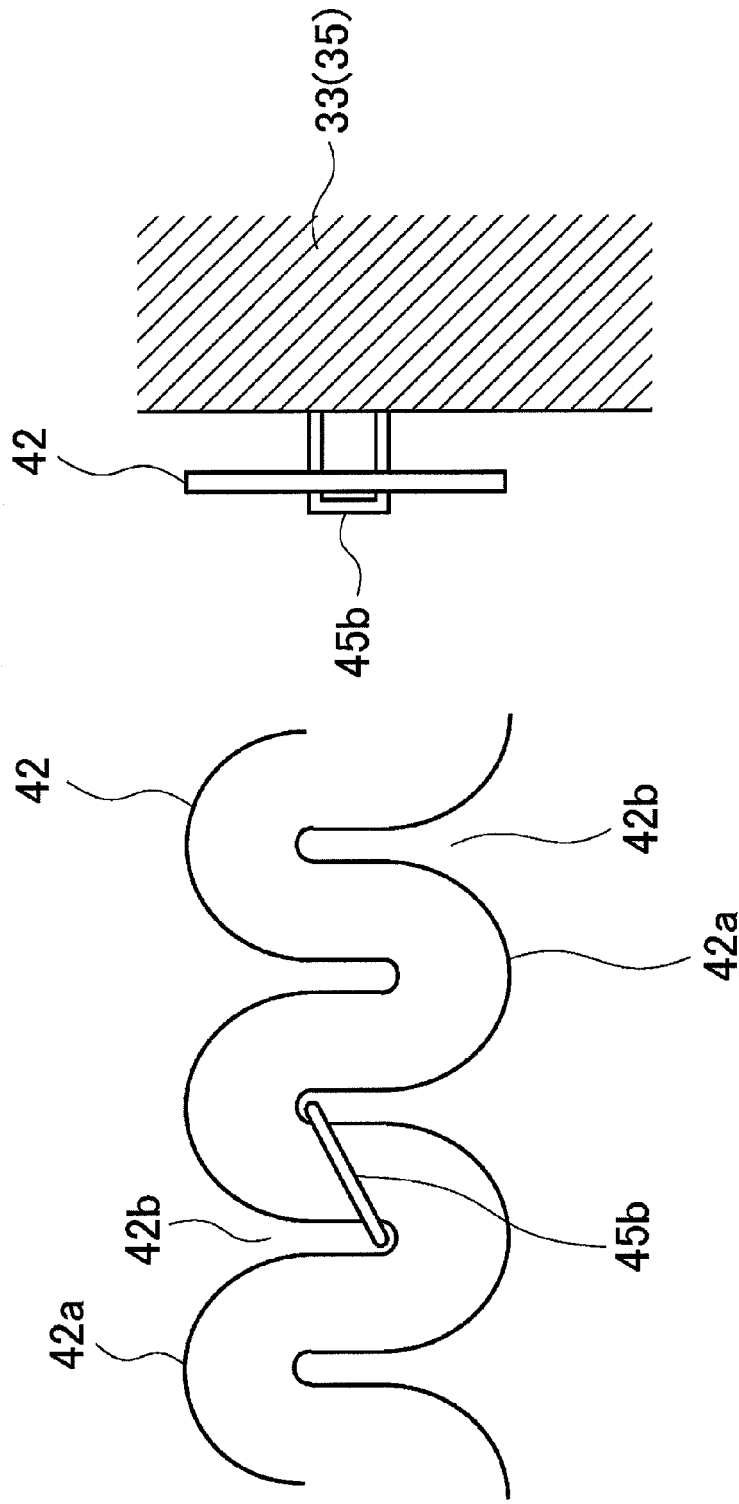

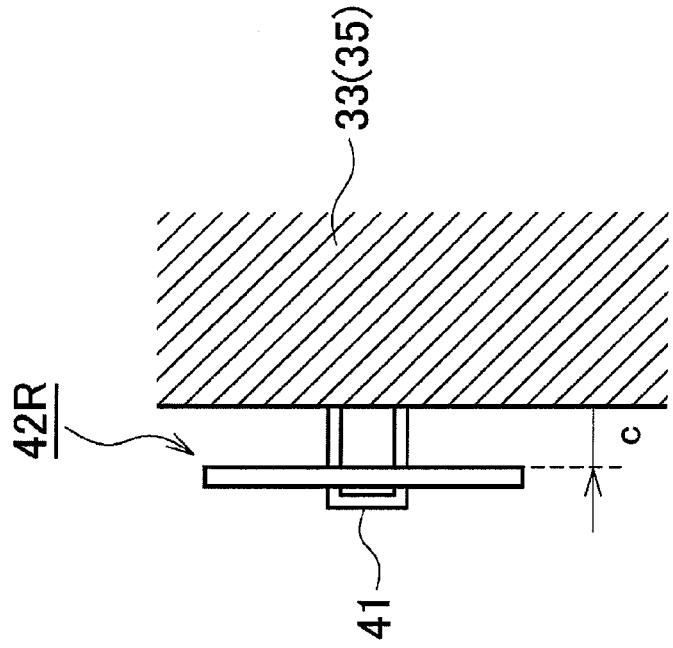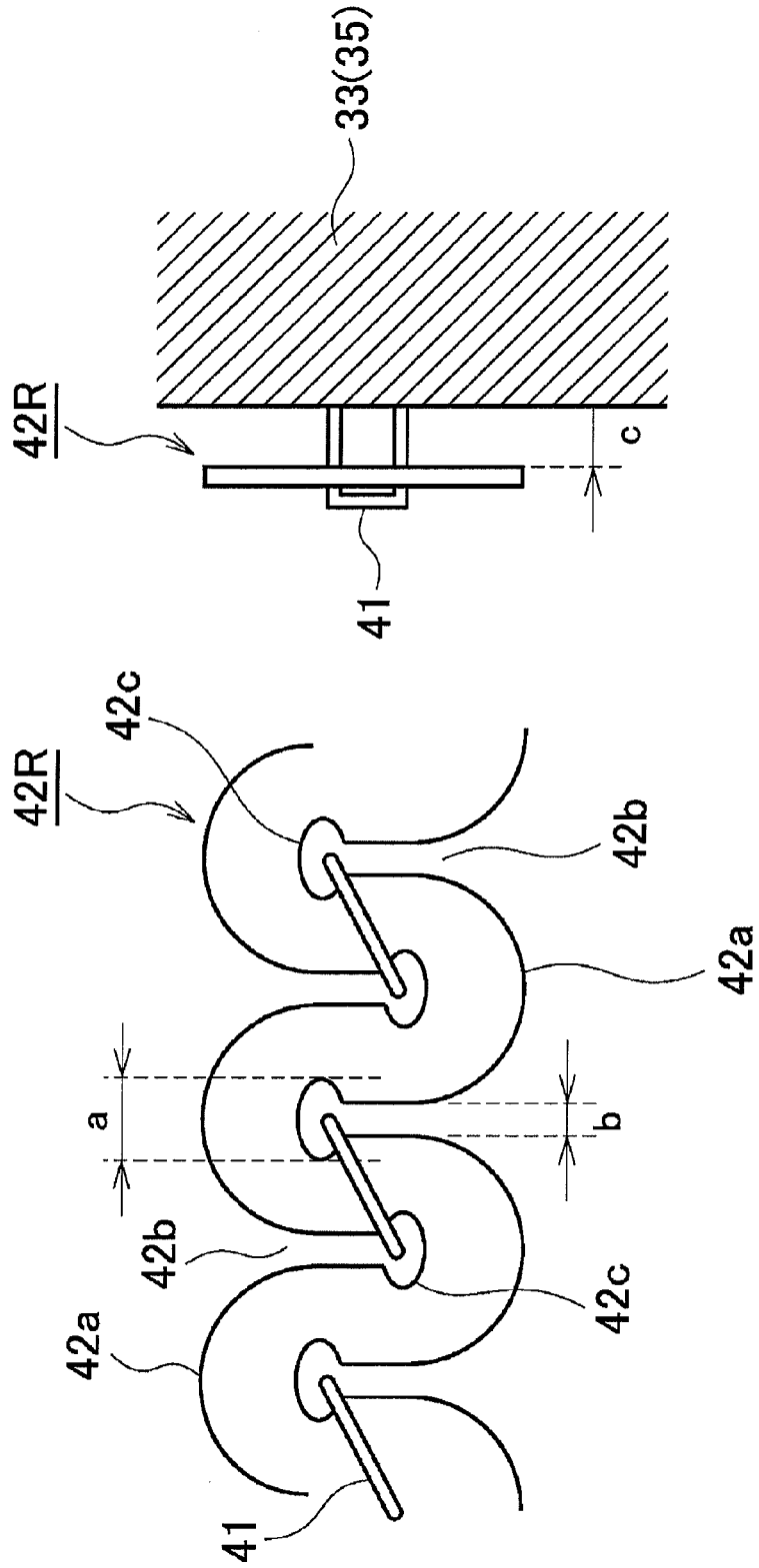

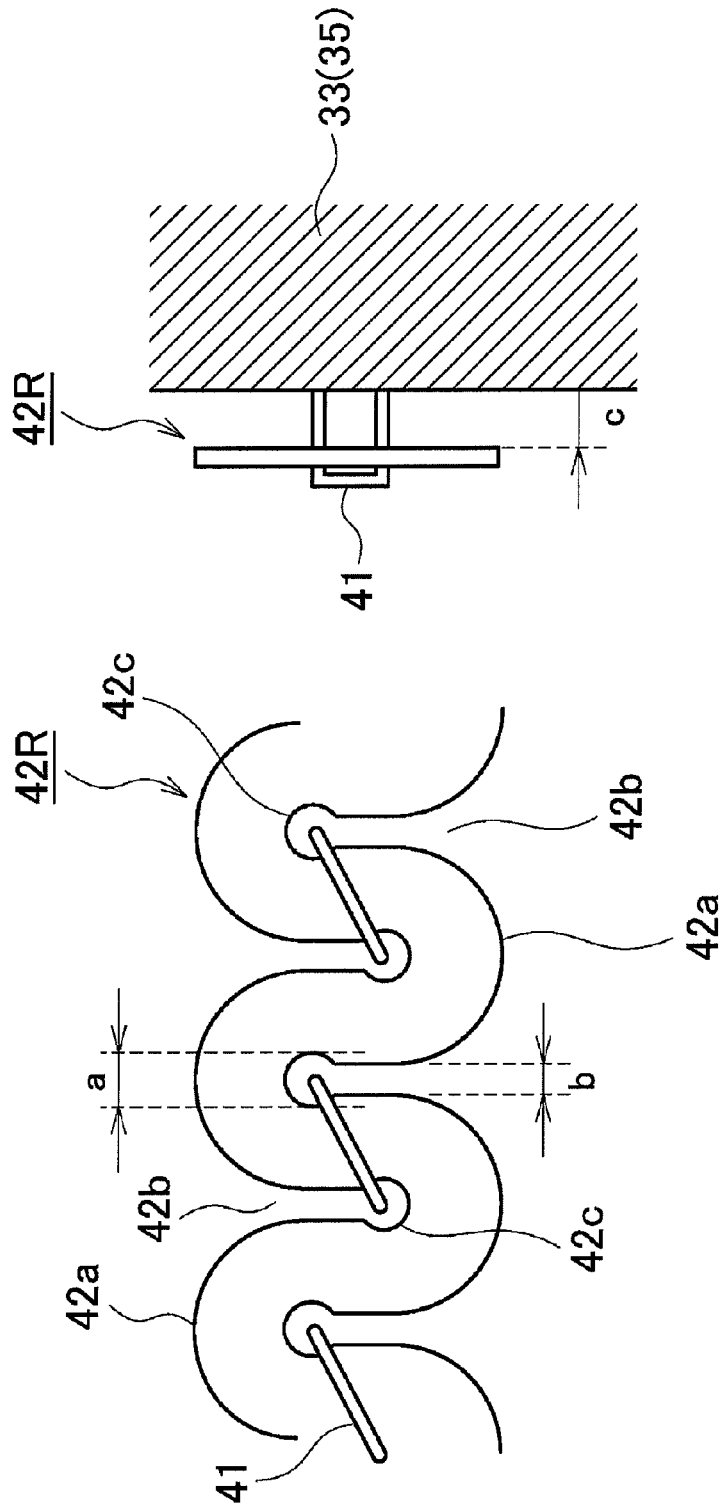

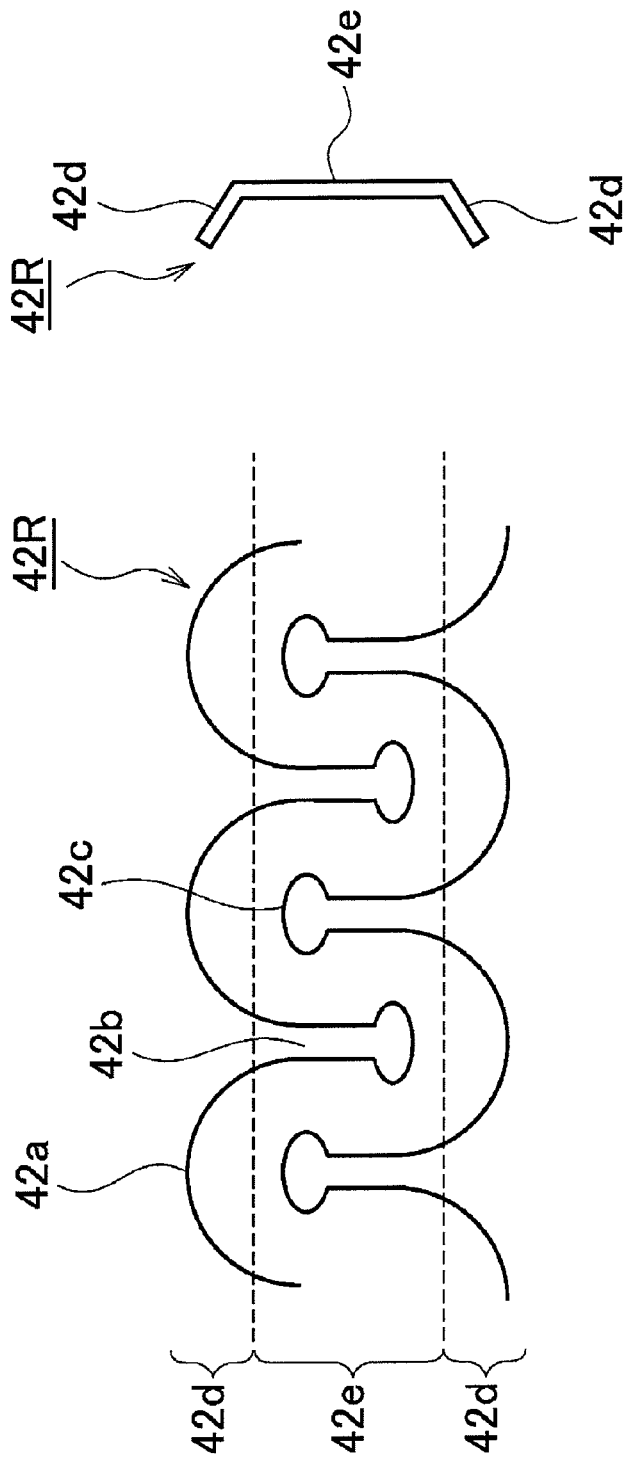

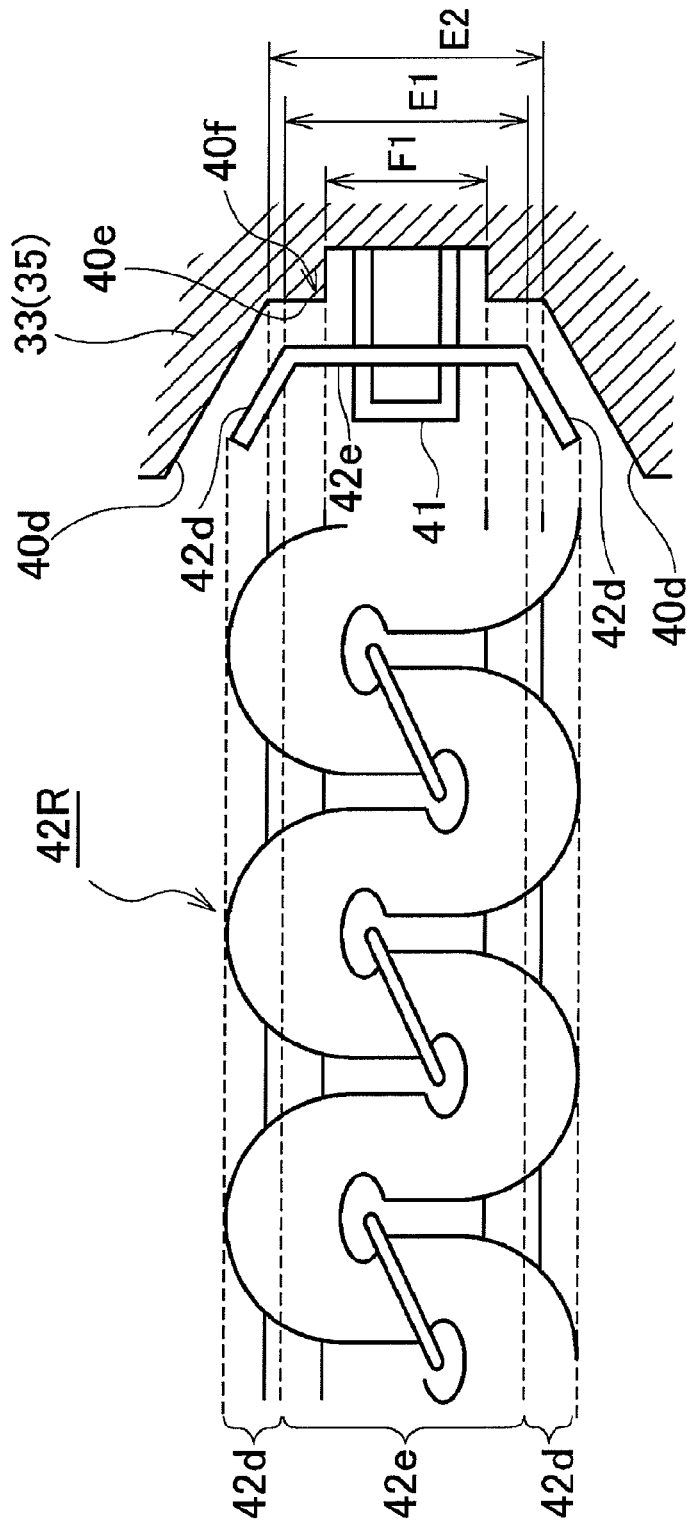

HEATING DEVICE, SUBSTRATE PROCESSING APPARATUS, AND METHOD OF MANUFACTURING SEMICONDUCTOR DEVICE

CROSS-REFERENCE TO RELATED PATENT APPLICATION

This U.S. non-provisional patent application claims priority under 35 U.S.C. §119 of Japanese Patent Applications No. 2009-169938 filed on Jul. 21, 2009, and No. 2010-145457 filed on Jun. 25, 2010, in the Japanese Patent Office, the entire contents of which are hereby incorporated by reference.

BACKGROUND OF THE INVENTION

1. Field of the Invention

The present invention relates to a heating device, a substrate processing apparatus configured to process a substrate, and a method of manufacturing a semiconductor device.

2. Description of the Prior Art

As a process using a method of manufacturing a semiconductor device such as a dynamic random access memory (DRAM), a substrate processing process in which a substrate such as a silicon wafer is heated to be processed has been performed. Such a substrate processing process has been performed by using a substrate processing apparatus, which includes a process chamber configured to accommodate a substrate to process the substrate, and a heating device configured to heat the inside of the process chamber. The heating device includes a ring shaped heating element surrounding the outer circumference of the process chamber, and a ring shaped insulating body installed along the outer circumference of the heating element. Respectively at the upper and lower ends of the heating element, a mountain part and a valley part (cutout part) are alternately connected in plurality to form a meander shape (for example, refer to Patent Document 1 below).

In addition, a heating device includes a ring shaped heating element surrounding the outer circumference of a process chamber, an insulating body installed in a manner of surrounding the outer circumference of the heating element, and a holding member configured to fix the heating element to the inner wall of the insulating body (for example, refer to Patent Document 2 below).

[Patent Document 1]
Japanese Unexamined Patent Application Publication No. 2007-88325

[Patent Document 2]
Japanese Unexamined Patent Application Publication No. H4-318923

Both ends of the above-described heating element having a ring shape penetrate a side wall of the insulating body and are fixed, and simultaneously, the respective valley parts of the heating element are independently fixed to an inner circumferential side wall of the insulating body, so that the heating element is held to the inner circumferential side of the insulating body. To fix the respective valley parts of the heating element to the inner circumferential side wall of the insulating body, a holding body configured as a pin having, for example, a bridge shape has been used. That is, both ends of the holding body are independently inserted into the ends (valley bottom parts) respectively of the valley parts adjacent to both the ends of the holding body and fixed to the inner circumferential side wall of the insulating body, so as to suppress misaligning of the heating element.

In addition, in the above-described heating device, when the heating element thermally expands while temperature is increased, the heating element contacts the insulating body, so that members thereof may be damaged. Especially, since a displacement amount of the heating element cumulatively increases as it goes away from the holding member, the heating element easily contacts the insulating body at a place distant from the holding member.

However, in the above-described configuration, when the heating element with temperature being increased is thermally deformed, the gaps between the valley parts decrease, so that a holding opening may be sheared.

SUMMARY OF THE INVENTION

An object of the present invention is to provide a heating device, a substrate processing apparatus, and a method of manufacturing a semiconductor device, which can suppress differences between heating elements, and simultaneously, can suppress shearing of holding openings due to thermal deformation of the heating elements, and can suppress a contact between the heating element and an insulating body or an interference between the heating element and a pin member when the heating element thermally expands, and can reduce a damage of components of the heating device.

According to an aspect of the present invention, there is provided a heating device comprising: a heating element including a mountain part and a valley part alternately connected in plurality to form a meander shape and a holding body receiving part at an end of the valley part wherein a width of the holding body receiving part is greater than that of the valley part; an insulating body installed at an outer circumference of the heating element with both ends of the heating element fixed thereto; and a staple pin penetrating the holding body receiving part and a neighboring holding body receiving part to fix the heating element to the insulating body, wherein the staple pin is dislocated with respect to a center of the holding body receiving part and an amount of dislocation of the staple pin varies according to a distance between the holding body receiving part and the both ends.

According to another aspect of the present invention, there is provided a substrate processing apparatus comprising: a heating device comprising a heating element including a mountain part and a valley part alternately connected in plurality to form a meander shape and a holding body receiving part at an end of the valley part wherein a width of the holding body receiving part is greater than that of the valley part; an insulating body installed at an outer circumference of the heating element with both ends of the heating element fixed thereto; and a staple pin penetrating the holding body receiving part and a neighboring holding body receiving part to fix the heating element to the insulating body, wherein the staple pin is dislocated with respect to a center of the holding body receiving part and an amount of dislocation of the staple pin varies according to a distance between the holding body receiving part and the both ends; and a process chamber installed in the heating device to process the substrate.

According to another aspect of the present invention, there is provided a method of manufacturing a semiconductor device, the method comprising: loading a substrate into a process chamber installed in a heating device; and increasing temperature of a heating element provided to the heating device to heat the substrate in the process chamber in a state where both ends of the heating element including a mountain part and a valley part that are alternately connected in plurality in a meander shape are fixed to an insulating body installed at an outer circumference of the heating element, and simultaneously, holding bodies are disposed in holding body receiving parts respectively installed at ends of the valley parts and formed as cutout parts having a width larger than a width of the valley part, and are fixed to the insulating body, so as to hold a position of the heating element.

According to another aspect of the present invention, there is provided a heating device comprising: a heating element having a ring shape; an insulating body installed in a manner of surrounding an outer circumference of the heating element; and a fixation part configured to fix the heating element to an inner wall of the insulating body, wherein, at least when the heating element is at a room temperature, a distance between the heating element and the inner wall of the insulating body is set to be increased as it goes away from the fixation part.

According to another aspect of the present invention, there is provided a method of manufacturing a semiconductor device, the method comprising: loading a substrate into a process chamber installed at an inside of a heating element in a heating device, the heating device including: the heating element having a ring shape; an insulating body installed in a manner of surrounding an outer circumference of the heating element; and a fixation part configured to fix the heating element to an inner wall of the insulating body; and increasing temperature of the heating element to heat the substrate in the process chamber and process the substrate, wherein, at least when the heating element is at a room temperature, a distance between the heating element and the inner wall of the insulating body is set to be increased as it goes away from the fixation part.

BRIEF DESCRIPTION OF THE DRAWINGS

FIG. 5A is a partial enlarged view illustrating the ring shaped part according to the first embodiment of the present invention, and FIG. 5B is a side view illustrating an enlarged part of FIG. 5A.

FIG. 11A is a partial enlarged view illustrating a periphery of a pin member as a modified example of a fixation part according to the present invention, and FIG. 11B is a side view illustrating an enlarged part of FIG. 11A.

FIG. 19A is a partial enlarged view illustrating the ring shaped part according to the first embodiment of the present invention, and FIG. 19B is a side view illustrating an enlarged part of FIG. 19A.

FIG. 22A is a partial enlarged view illustrating the ring shaped part according to a modified example of the first embodiment of the present invention, and FIG. 22B is a side view illustrating an enlarged part of FIG. 22A.

FIG. 27A is a partial enlarged view illustrating a ring shaped part according to the second embodiment of the present invention, and FIG. 27B is a side view illustrating an enlarged part of FIG. 27A.

FIG. 29A and FIG. 29B are schematic views illustrating a modified example of a storage part according to the second embodiment of the present invention, FIG. 29A being a partial enlarged view illustrating the storage part accommodating a ring shaped part, FIG. 29B being a side view illustrating an enlarged part of FIG. 29A.

DETAILED DESCRIPTION OF THE PREFERRED EMBODIMENTS

First Embodiment of the Present Invention

A first embodiment of the present invention will be described hereinafter with reference to the attached drawings.

Figure 1:
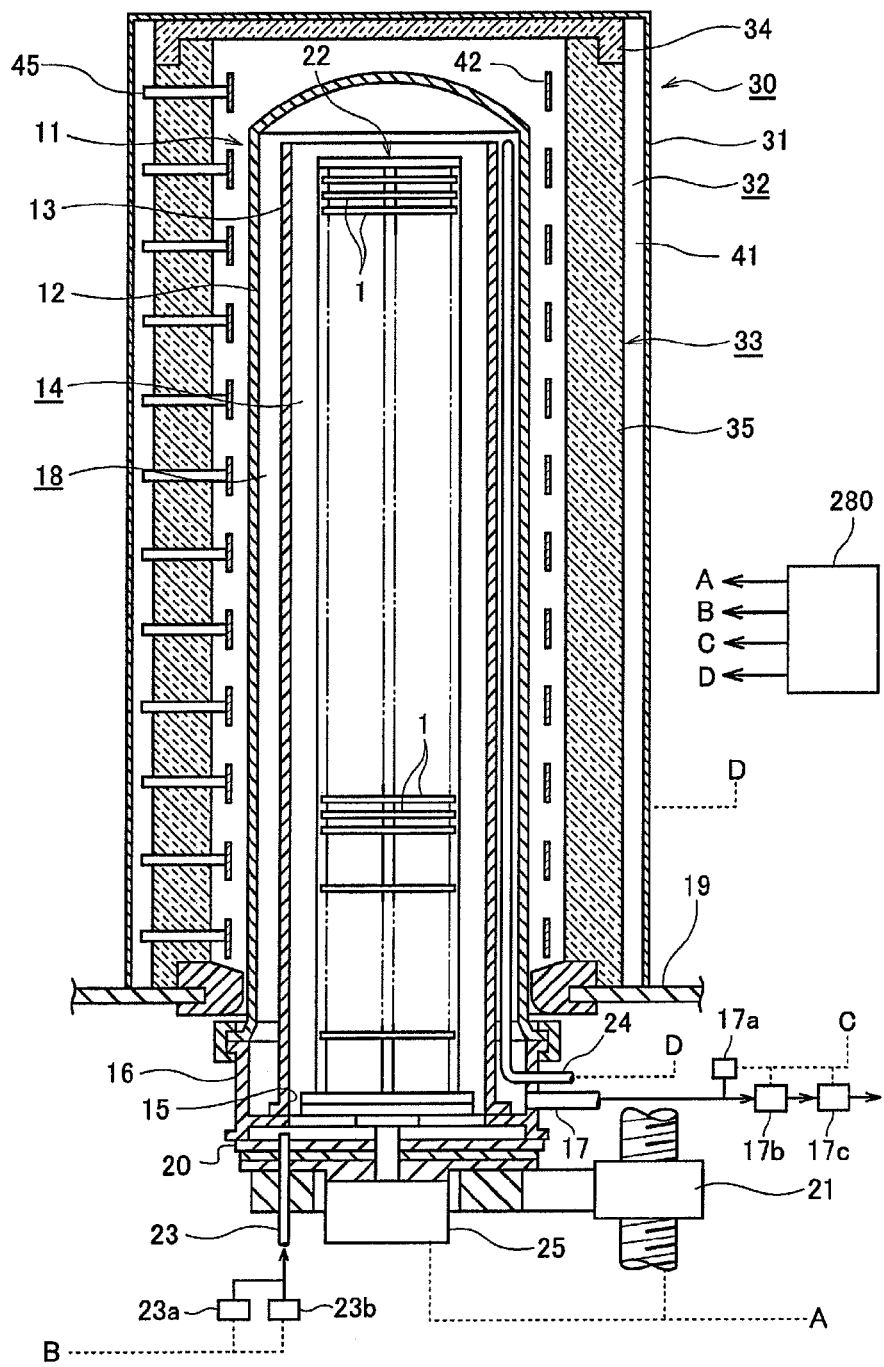
FIG. 1 is a vertical cross-sectional view illustrating a substrate processing apparatus according to a first embodiment of the present invention.
Figure 2:
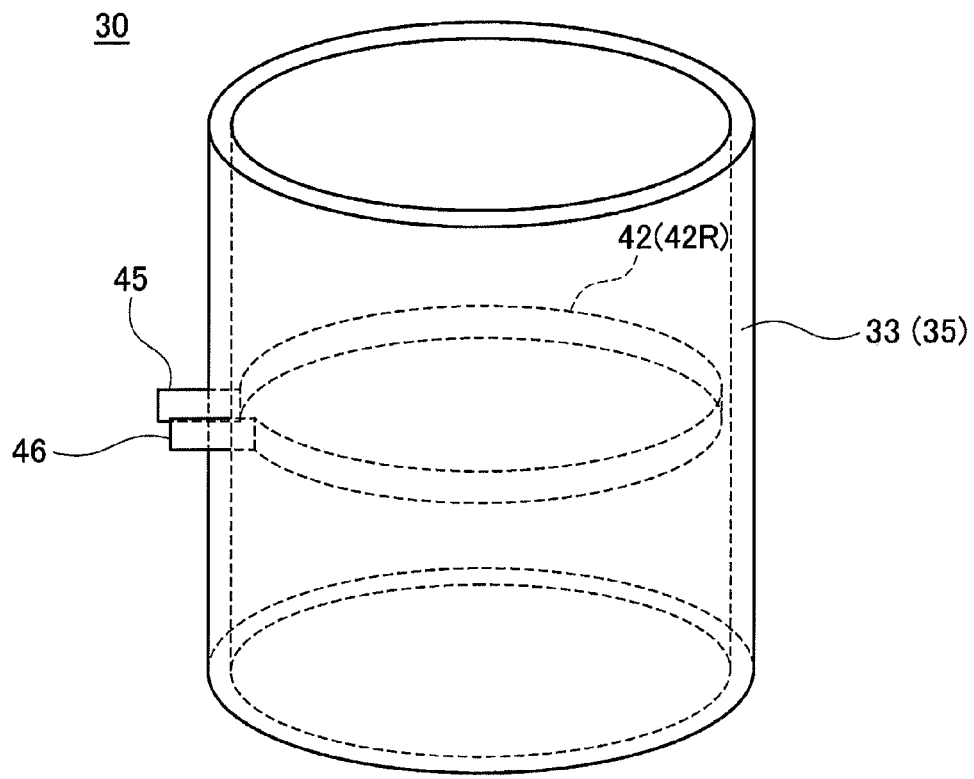
FIG. 2 is perspective view illustrating a heater unit according to the first embodiment of the present invention.
Figure 3:
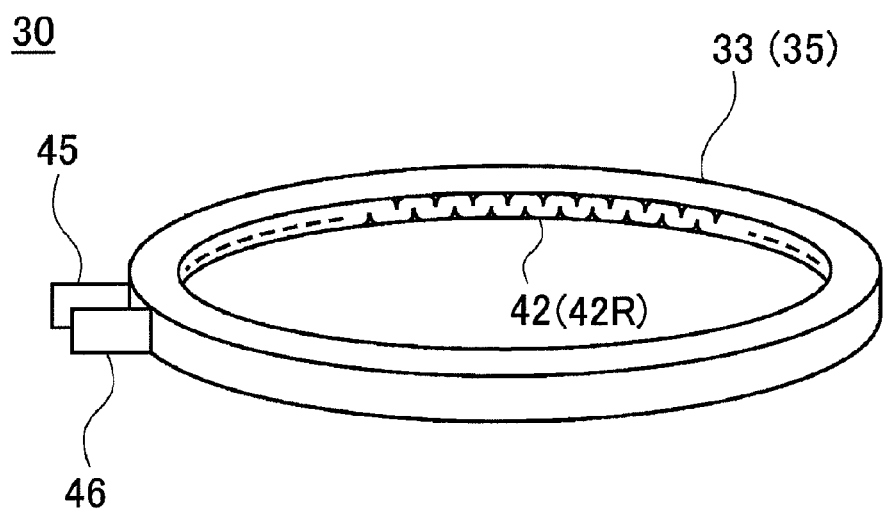
FIG. 3 is a partial enlarged view illustrating the heater unit according to the first embodiment of the present invention.
Figure 4A:
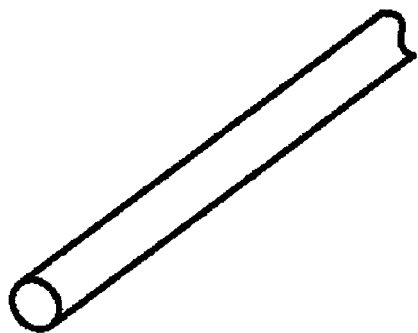
FIG. 4A is a schematic view illustrating a line shaped material constituting a ring shaped part, according to the first embodiment of the present invention.
Figure 4B:
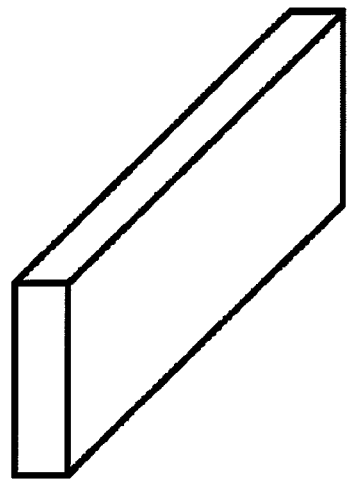
FIG. 4B is a schematic view illustrating a plate shaped material constituting the ring shaped part.

FIG. 1 is a vertical cross-sectional view illustrating a substrate processing apparatus according to the first embodiment of the present invention. FIG. 2 is perspective view illustrating a heater unit according to the first embodiment of the present invention. FIG. 3 is a partial enlarged view illustrating the heater unit according to the first embodiment of the present invention. FIG. 4A is a schematic view illustrating a line shaped material constituting a ring shaped part, according to the first embodiment of the present invention. FIG. 4B is a schematic view illustrating a plate shaped material constituting the ring shaped part. FIG. 19A is a partial enlarged view illustrating the ring shaped part according to the first embodiment of the present invention, and FIG. 19B is a side view illustrating an enlarged part of FIG. 19A.

(1) Configuration of Substrate Processing Apparatus

Hereinafter, a configuration of the substrate processing apparatus relevant to one embodiment of the present invention will now be described. As shown in FIG. 1, the substrate processing apparatus relevant to the current embodiment is configured as a batch type vertical hot wall shaped depressurization chemical vapor deposition (CVD) apparatus.

The substrate processing apparatus relevant to the current embodiment includes a vertical process tube 11 that is vertically supported. The process tube 11 includes an outer tube 12 and an inner tube 13. Each of the outer tube 12 and the inner tube 13 is integrally made of a material, for example, such as quartz ($SiO_2$) or silicon carbide (SiC) having high thermal resistance. The outer tube 12 has a cylindrical shape with a closed top side and an opened bottom side. The inner diameter of the outer tube 12 is greater than the inner diameter of the inner tube 13. The outer tube 12, in a manner of surrounding the outside of the inner tube 13, is installed coaxially with the inner tube 13. At the inside of the inner tube 13, a process chamber 14 is formed to accommodate and process wafers 1 that are horizontally stacked in multiple stages by a boat 22 as a substrate holder. A bottom opening of the inner tube 13 constitutes a furnace port 15 configured to load and unload the boat 22.

Between the outer tube 12 and the inner tube 13, the lower end parts each is air-tightly sealed by a manifold 16 having a circular ring shape. The manifold 16 is made of, for example, SUS (stainless steels prescribed in the Japanese Industrial Standard). For replacement of the inner tube 13 and the outer tube 12, the manifold 16 is installed as an attaching/detaching member on each of the inner tube 13 and the outer tube 12. Since the manifold 16 is horizontally supported by a heater base 19, the process tube 11 can be vertically fixed.

An upstream end of an exhaust pipe 17 is connected to a side wall of the manifold 16. The inside of the exhaust pipe 17 communicate with the inside of an exhaust passage 18 that is formed as a cylindrical hollow body (gap) between the inner tube 13 and the outer tube 12. The horizontal cross-sectional shape of the exhaust passage 18 is, for example, a circular ring shape having a constant width. The exhaust pipe 17 is connected to the lowermost part of the exhaust passage 18 as a cylindrical hollow body. At the exhaust pipe 17, in order from the upstream, a pressure sensor 17a, an auto pressure controller (APC) valve 17b as a pressure regulating valve, and a vacuum exhaust device 17c are installed. The vacuum exhaust device 17c is operated to control an opened area of the APC valve 17b based on pressure detected by the pressure sensor 17a, so that the pressure in the process chamber 14 can be maintained at a predetermined pressure (vacuum degree). Mainly, the exhaust pipe 17, the pressure sensor 17a, the APC valve 17b, and the vacuum exhaust device 17c constitute an exhaust line configured to exhaust atmosphere in the process chamber 14. The pressure sensor 17a, the APC valve 17b, the vacuum exhaust device 17c are connected to a controller 280 as a control unit. The controller 280 is configured to control the opened area of the APC valve 17b based on pressure information detected by the pressure sensor 17a such that the pressure in the process chamber 14 can be maintained at a predetermined process pressure.

A circular plate shaped seal cap 20 configured to close a bottom opening of the manifold 16 is in contact with the manifold 16 from the lower side of the manifold 16 along the vertical direction. The seal cap 20 is configured such that the outer diameter of the seal cap 20 is substantially the same as the outer diameter of the outer tube 12 and the outer diameter of the manifold 16. The seal cap 20 is configured to be vertically lifted and lowered by a boat elevator 21 (partially shown) installed at the outside of the process tube 11. At the lower side of the seal cap 20, a rotary mechanism 25 is installed. A rotation shaft of the rotary mechanism 25 vertically penetrates the seal cap 20. On the rotation shaft of the rotary mechanism 25, the above-described boat 22 is vertically based and supported. As described above, the boat 22 is configured to hold a plurality of wafers 1 in a state where the wafers 1 are horizontally oriented and stacked in multiple stages with their centers being aligned.

By operating the rotary mechanism 25, the boat 22 can be rotated in the process chamber 14.

A gas introduction pipe 23 is vertically connected to the seal cap 20. A raw material supply device 23a and a carrier gas supply device 23b each is connected to an upstream end (lower end) of the gas introduction pipe 23. A downstream end (upper end) of the gas introduction pipe 23 is configured to supply (eject) gas toward the inside of the process chamber 14. Gas supplied from the gas introduction pipe 23 into the process chamber 14 (into the inner tube 13) flows on the surface of each wafer 1 held in the process chamber 14, flows from a top opening of the inner tube 13 into the exhaust passage 18, and then, is exhausted from the exhaust pipe 17. Mainly, the gas introduction pipe 23, the raw material supply device 23a, and the carrier gas supply device 23b constitute a gas supply line configured to supply gas into the process chamber 14. The raw material supply device 23a and the carrier gas supply device 23b are connected to the controller 280. The controller 280 controls the raw material supply device 23a and the carrier gas supply device 23b, and is configured to supply flow raw material gas and carrier gas at a predetermined time at a predetermined flowrate into the process chamber 14.

In addition, at the gap between the outer tube 12 and the inner tube 13, a temperature sensor 24 is vertically installed. The temperature sensor 24 is connected to the controller 280.

The controller 280 controls, based on temperature information detected by the temperature sensor 24, the power condition of each of heating elements 42 included by a heater unit 30 to be described later (controls power supply performed by a couple of power feeding parts 45 and 46) to maintain the surface temperature of the wafer 1 held in the process chamber 14, at a predetermined process temperature.

(2) First Exemplified Configuration of Heater Unit

At the outside of the outer tube 12, the heater unit 30 as a heating device configured to heat the inside of the process tube 11 is installed in a manner of surrounding the outer tube 12. The heater unit 30 includes the heating elements 42, an insulating body 33, holding bodies 41, and a case 31.

One or more heating elements 42 are vertically installed in the manner of surrounding the outer tube 12. As shown in FIG. 2 and FIG. 3, the heating elements 42 each includes a ring shaped part 42R and the couple of power feeding parts 45 and 46. The ring shaped part 42R is configured to have a ring shape in the manner of surrounding the outer circumference of the outer tube 12. Both end parts of the ring shaped part 42R are fixed in a state where they are close to each other without contact, and are in electrically non-contact with each other. That is, the ring shaped part 42R is configured to electrically have an imperfect circular shape, for example, a C-shaped ring shape. As a material constituting the ring shaped part 42R, a resistance heating material, for example, such as Fe—Cr—Al alloy, $MoSi_2$, and SiC may be used, and the shape of the material may be a line shape as shown in FIG. 4A, or be a plate shape as shown in FIG. 4B. The couple of power feeding parts 45 and 46 penetrate the insulating body 33 (a side wall part 35) to be described later, and are fixed to the insulating body 33, and simultaneously, end parts of the power feeding parts 45 and 46 are connected to both ends of the ring shaped part 42R, respectively. The couple of power feeding parts 45 and 46 are made of a conductive material such as metal. Through the couple of power feeding parts 45 and 46, by applying a current from one end of the ring shaped part 42R to the other end, the ring shaped part 42R is heated to increase the temperature in the process tube 11. The couple of power feeding parts 45 and 46 are connected to the controller 280.

The insulating body 33 is installed to surround the outer circumference of the ring shaped part 42R. The insulating body 33 includes the side wall part 35 having a cylindrical shape with open upper and lower ends, and a top wall part 34 configured to cover an upper opening of the side wall part 35, so as to have a cylindrical shape with an open lower end. The insulating body 33 is installed coaxially with each of the outer tube 12 and the ring shaped part 42R. The side wall part 35 and the top wall part 34 is made of an insulating material, for example, such as alumina ($Al_2O_3$) or silica ($SiO_2$) having a fiber shape or a sphere shape. The side wall part 35 and the top wall part 34 each is integrally formed using a method, for example, such as a vacuum foam method. However, the side wall part 35 is not limited to the integrally forming, and thus, may be configured by stacking a plurality of circular insulating materials in a plurality of stages. According to the configuration as described above, when stress is added to the side wall part 35, breakage of the side wall part 35 can be suppressed, or maintenance performance can be improved.

FIG. 19A is a partial enlarged view (plan view) illustrating the ring shaped part 42R viewed from the center side of the ring shaped part 42R (viewed from the process tube 11). Respectively at the upper and lower ends of the ring shaped part 42R, a mountain part (protrusion part) 42a and a valley part (cutout part) 42b are alternately connected in plurality. That is, the ring shaped part 42R has a meander shape (wave shape). At the end (bottom part) of each of the valley parts 42b installed at the upper and lower ends of the ring shaped part 42R, a holding body receiving part 42c, for example, with an elliptical shape being formed as a cutout part is installed. The width of the holding body receiving part 42c (a width along the circumferential direction of the ring shaped part 42R, and also referred to as a first width 'a' hereinafter) is greater than the width of the valley part 42b (a width along the circumferential direction of the ring shaped part 42R, and also referred to as a second width 'b' hereinafter).

The couple of power feeding parts 45 and 46 penetrate the insulating body 33 (the side wall part 35) and are fixed to the insulating body 33, and simultaneously, as shown in FIG. 19A and FIG. 19B, through the plurality of holding bodies 41, the respective valley parts 42b are independently fixed to the inner circumferential surface of the insulating body 33 (the side wall part 35), so that the ring shaped part 42R is held to the inner circumferential surface of the insulating body 33. The holding bodies 41 each is configured to be disposed in the holding body receiving part 42c, and fixed to the insulating body 33. The holding body 41 is configured as a pin having a bridge shape (binder (clamp) shape). Both ends of the holding body 41 configured as a pin having a bridge shape are respectively inserted into the holding body receiving parts 42c adjacent to both the ends, from the center side of the ring shaped part 42R to the outside (to the side wall part 35), so that both the ends are stuck and fixed to the inner circumferential surface of the insulating body 33 (the side wall part 35). The outer circumferential surface of the ring shaped part and the inner circumferential surface of the side wall part 35 are held to be spaced a predetermined distance (a width along the radial direction of the ring shaped part 42R, and also referred to as a third width 'c' hereinafter) from each other without contact, and are fixed. The holding body 41 is not limited to the above-described bridge shape, and thus, may be configured as an L-shaped pin with an end being inserted and fixed into the inner circumferential surface of the insulating body 33 (the side wall part 35), or may be configured as a T-shaped pin with the center part being inserted and fixed into the inner circumferential surface of the insulating body 33 (the side wall part 35).

According to the configuration as described above, a greater movement value along the circumferential direction of the ring shaped part 42R than that in the related art is secured. That is, the ring shaped part 42R is fixed, maximally securing a movement value corresponding to the width (the first width 'a') of the holding body receiving part 42c along the circumferential direction of the ring shaped part 42R. In addition, along the radial direction of the ring shaped part 42R, a predetermined movement value is secured. That is, the ring shaped part 42R is fixed, maximally securing a movement value corresponding to the third width 'c' along the radial direction of the ring shaped part 42R.

When being heated, the ring shaped part 42R having a meander shape tends to grow along the circumferential direction or the radial direction by thermal expansion. According to the current embodiment, although the ring shaped part 42R is grown along the circumferential direction by thermal expansion, if a relevant growth amount is less than the above-described movement value (maximally the second width 'b'), the interference (contact) between the ring shaped part 42R and the holding body 41 is suppressed. As a result, a case such as missing of the holding body 41 is suppressed. In addition, compressive stress affecting the ring shaped part 42R is reduced to suppress deformation, a crack or a short circuit of the ring shaped part 42R.

When the growth amount of the ring shaped part 42R is greater than a predetermined amount, and a movement value along the circumferential direction of the ring shaped part 42R is zero, plastic stress is added to each part of the ring shaped part 42R, so that the ring shaped part 42R may be deformed. For example, the ring shaped part 42R may be deformed in the manner where the width (the second width of 'b') of the valley part 42b is decreased. According to the current embodiment, the width (the first width 'a') of the holding body receiving part 42c where the holding body 41 is disposed is greater than the width (the second width 'b') of the valley part 42b. Thus, even when the ring shaped part 42R is deformed to decrease the width (the second width 'b') of the valley part 42b, it is difficult that the holding body 41 and the ring shaped part 42R interfere with (contact) each other, so as to suppress shearing of the holding body 41.

In addition, even when the ring shaped part 42R is grown along the radial direction by thermal expansion, if a relevant growth amount is less than the above-described movement value (maximally the third width 'c'), the contact between the ring shaped part 42R and an inner circumferential wall of the insulating body 33 is suppressed. In addition, since a local temperature increase (abnormal temperature increase) of the ring shaped part 42R or meltdown of the ring shaped part 42R is suppressed, the service life of the ring shaped part 42R or the insulating body 33 can be increased. In addition, a uniform temperature distribution can be achieved in the process chamber 14.

The case 31 is installed in the manner of surrounding the outer circumference of the insulating body 33. For example, the case 31 has a cylindrical shape with a close upper end and an open lower end. For example, the case 31 is made of SUS (stainless steels prescribed in the Japanese Industrial Standard). A gap 32 between the outer circumferential surface of the insulating body 33 and the inner circumferential surface of the case 31 functions as a space for cooling air. An exhaust port penetrating the top wall part 34 and a top wall of the case 31 may be provided to forcibly cool the atmosphere between the insulating body 33 and the outer tube 12.

(3) Second Exemplified Configuration of Heater Unit

At the outside of the outer tube 12, the heater unit 30 as a heating device configured to heat the inside of the process tube 11 is installed in a manner of surrounding the outer tube 12. The heater unit 30 includes the heating elements 42 having a ring shape, the insulating body 33 surrounding the outer circumferences of the heating elements 42, the couple of power feeding parts 45 and 46 as a fixation part connected respectively to both ends of the heating elements 42, and the case 31 surrounding the outer side of the insulating body 33.

One or more heating elements 42 are vertically installed in the manner of surrounding the outer tube 12. As shown in FIG. 2 and FIG. 3, the heating elements 42 each includes a ring shape in the manner of surrounding the outer circumference of the outer tube 12. Both end parts of the heating element 42 are fixed in a state where they are close to each other without contact, and are in electrically non-contact with each other. That is, the heating element 42 is configured to electrically have an imperfect circular shape, for example, a C-shaped ring shape. As a material constituting the heating element 42, a resistance heating material, for example, such as Fe—Cr—Al alloy, $MOSi_2$, and SiC may be used, and the shape of the material may be a line shape as shown in FIG. 4A, or be a plate shape as shown in FIG. 4B. As shown in FIG. 2, FIG. 3, and FIG. 5, respectively at the upper and lower ends of the heating element 42, the mountain part (protrusion part) 42a and the valley part (cutout part) 42b are alternately connected in plurality. That is, the heating element 42 has a meander shape (wave shape).

Both the end parts of the heating element 42 are connected with the end parts of the couple of power feeding parts 45 and 46, respectively. The couple of power feeding parts 45 and 46 penetrate the insulating body 33 (the side wall part 35) to be described later, and are fixed to the insulating body 33. That is, the couple of power feeding parts 45 and 46 function as a fixation part configured to fix the heating element 42 to an inner wall of the insulating body 33. FIG. 5A is a partial enlarged view (plan view) illustrating a fringe of the power feeding parts 45 and 46 viewed from the center side of the heating element 42 (viewed from the process tube 11). As such, the heating element 42 is fixed to only a single place (the end part of the heating element 42) by the couple of power feeding parts 45 and 46 as a fixation part. That is, except for the couple of power feeding parts 45 and 46, a fixing method using a holding body such as a pin is not used.

The couple of power feeding parts 45 and 46 are constituted by a conductive material such as metal. Through the couple of power feeding parts 45 and 46, by applying a current from one end of the heating element 42 to the other end, the heating element 42 is heated to increase the temperature in the process tube 11. The application of a current to the heating element 42 through the couple of power feeding parts 45 and 46 is controlled by the controller 280.

The insulating body 33 is installed to surround the outer circumference of the heating element 42. The insulating body 33 includes the side wall part 35 having a cylindrical shape with open upper and lower ends, and the top wall part 34 configured to cover the upper opening of the side wall part 35, so as to have a cylindrical shape with an open lower end. The insulating body 33 is installed coaxially with the outer tube 12. The side wall part 35 and the top wall part 34 is made of an insulating material, for example, such as alumina ($Al_2O_3$) or silica ($SiO_2$) having a fiber shape or a sphere shape. The side wall part 35 and the top wall part 34 each is integrally formed using a method, for example, such as a vacuum foam method. However, the side wall part 35 is not limited to the integrally forming, and thus, may be configured by stacking a plurality of circular insulating materials in a plurality of stages. According to the configuration as described above, when stress is added to the side wall part 35, breakage of the side wall part 35 can be suppressed, or maintenance performance can be improved.

The case 31 is installed in the manner of surrounding the outer circumference of the insulating body 33. For example, the case 31 has a cylindrical shape with a close upper end and an open lower end. For example, the case 31 is made of SUS (stainless steels prescribed in the Japanese Industrial Standard). The gap 32 between the outer circumferential surface of the insulating body 33 and the inner circumferential surface of the case 31 functions as a space for cooling air. The exhaust port penetrating the top wall part 34 and the top wall of the case 31 may be provided to forcibly cool the atmosphere between the insulating body 33 and the outer tube 12.

When being heated, the heating element 42 tends to grow along the circumferential direction or the radial direction by thermal expansion. As a result, the heating element 42 may contact and interfere with the inner wall of the insulating body 33. Especially, as in the current embodiment, when the heating element 42 has a meander shape, a growth amount increases, and a contact easily occurs. When the heating element 42 contacts and interferes with the inner wall of the insulating body 33, a local temperature increase (abnormal temperature increase) of the heating element 42 occurs to melt down the heating element 42. In addition, stress is added to the heating element 42 or the insulating body 33, and the heating element 42 or the insulating body 33 may be deformed. In addition, when, due to the extension along the radial direction of the heating element 42, the distance between the heating element 42 and the inner wall of the insulating body 33 is uneven along the circumferential direction of the heating element 42, uniformity in temperature distribution of the heating element 42 may be degraded along the circumferential direction, quality in processing a substrate may be decreased. That is, the temperature of the heating element 42 may abnormally increase at a place where the heating element 42 is close to the inner wall of the insulating body 33, or the temperature of the heating element 42 may decrease at a place where the heating element 42 is distant from the inner wall of the insulating body 33

Figure 6:
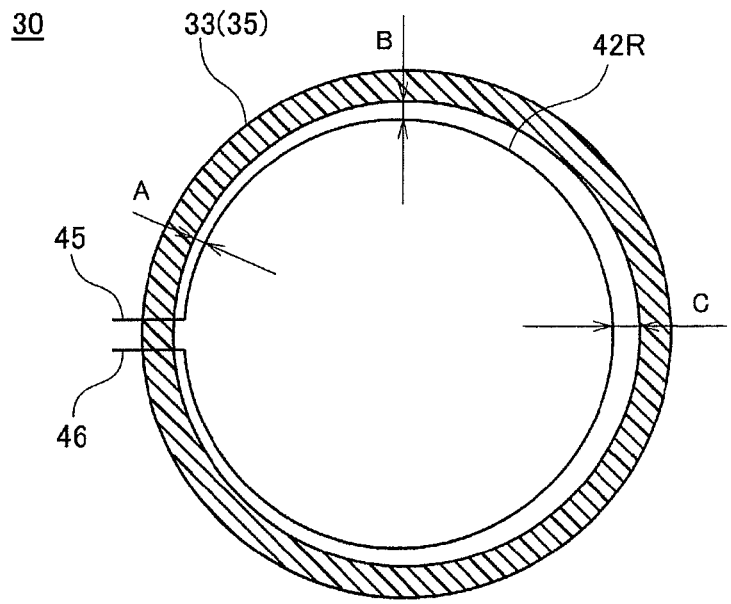
FIG. 6 is a horizontal cross-sectional view illustrating the heater unit before temperature is increased, according to the first embodiment of the present invention.

Therefore, in the current embodiment, at least when the heating element 42 is disposed at a room temperature, the distance between the heating element 42 and the inner wall of the insulating body 33 increases as it goes away from the power feeding parts 45 and 46 as a fixation part, thereby solving the above-described problem. FIG. 6 is a horizontal cross-sectional view illustrating the heater unit 30 before temperature is increased (in a room temperature), according to the current embodiment. As shown in FIG. 6, at least when the heating element 42 is at a room temperature, the distance between the heating element 42 and the inner wall of the insulating body 33 gradually increases as it goes away from the couple of power feeding parts 45 and 46, and thus, distances A, B, and C of FIG. 6 have a relationship of A<B<C.

Figure 8:
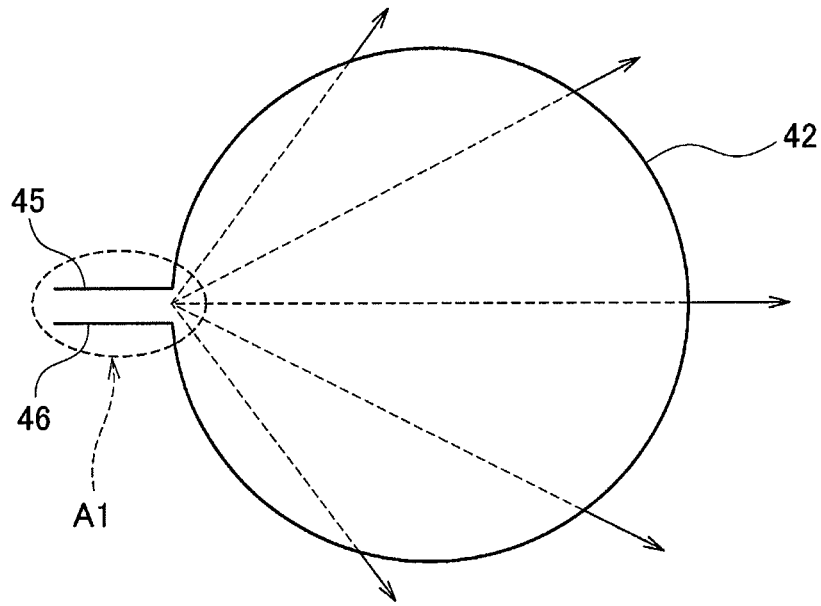
FIG. 8 is a schematic view illustrating expansion directions of a ring shaped part.

In this state, when the temperature of the heating element 42 is increased, for example, up to a temperature while a substrate is processed, each part of the heating element 42 expands in directions as shown in FIG. 8 by thermal expansion. FIG. 8 is a schematic view illustrating directions and lengths of arrows as displacement directions and displacement amounts respectively of parts of the heating element 42. Since the heating element 42 is fixed to a single place by the couple of power feeding parts 45 and 46, each part of the heating element 42 has a deviation in a manner of swelling outward from, as a starting point, a region (a region indicated by a symbol A1) adjacent to the couple of power feeding parts 45 and 46 (in a manner of going away from the couple of power feeding parts 45 and 46). A deviation amount of the heating element 42 increases as it goes away from the couple of power feeding parts 45 and 46.

Figure 7:
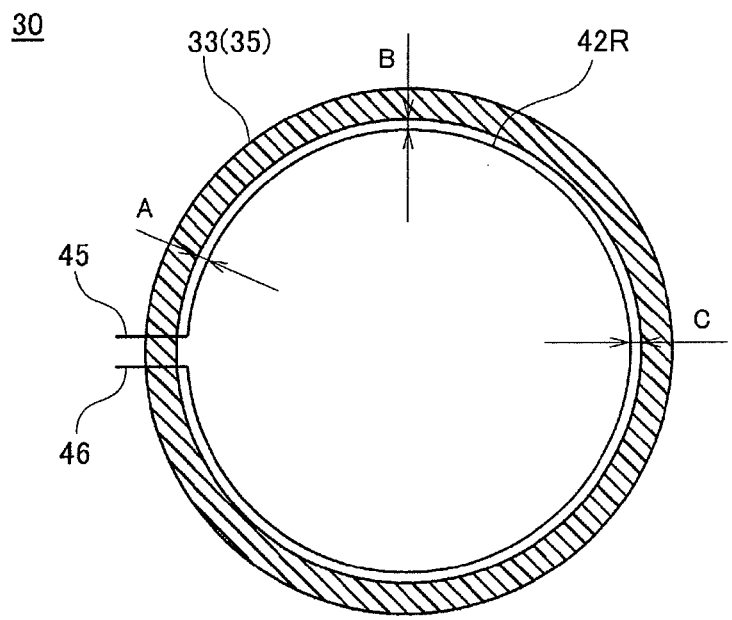
FIG. 7 is a horizontal cross-sectional view illustrating the heater unit after temperature is increased, according to the first embodiment of the present invention.

As a result, at least when the heating element 42 is at a substrate process temperature, the distances between the heating element 42 and the inner wall of the insulating body 33 are identical along the circumferential direction of the heating element 42. FIG. 7 is a horizontal cross-sectional view illustrating the heater unit 30 after temperature is increased (in a substrate process temperature), according to the current embodiment. As shown in FIG. 7, at least when the heating element 42 is at a substrate process temperature, the distances between the heating element 42 and the inner wall of the insulating body 33 are identical along the circumferential direction of the heating element 42 by thermal expansion, and thus, distances A, B, and C of FIG. 7 have a relationship of A≈B≈C.

(3) Substrate Processing Process

Next, as an example of substrate processing processes performed by the above-described substrate processing apparatus, a film forming process will now be described. In the following descriptions, the operation of each part of the substrate processing apparatus is controlled by the controller 280.

As shown in FIG. 1, the boat 22 charged with a plurality of wafers 1 (wafer charging) are raised upward and loaded into the process chamber 14 by the boat elevator 21 (boat loading). In this state, the bottom opening of the manifold 16 is sealed with the seal cap 20.

To maintain the inside of the process tube 11 at a predetermined pressure (vacuum degree), a vacuum exhaust operation is performed through the exhaust pipe 17. In addition, to maintain the inside of the process tube 11 at a predetermined temperature, the inside of the process tube 11 is heated by the heater unit 30. That is, through the couple of power feeding parts 45 and 46, by applying a current from one end of the ring shaped part 42R to the other end, the ring shaped part 42R having a meander shape is heated to increase the temperature in the process tube 11. At this time, to form a predetermined temperature distribution in the process chamber 14, the power condition of the heating element 42 of the heater unit 30 is feedback controlled based on temperature information detected by the temperature sensor 24. Subsequently, the boat 22 is rotated by the rotary mechanism 25, so as to rotate the wafers 1.

When being heated, the ring shaped part 42R having a meander shape tends to grow along the circumferential direction or the radial direction by thermal expansion. According to the current embodiment, greater movement values along the circumferential and radial directions of the ring shaped part 42R than those in the related art are secured. In addition, although the ring shaped part 42R is grown along the circumferential direction by thermal expansion, if a relevant growth amount is less than the above-described movement value (maximally the second width 'b'), the interference (contact) between the ring shaped part 42R and the holding body 41 is suppressed. As a result, a case such as missing of the holding body 41 is suppressed. In addition, compressive stress affecting the ring shaped part 42R is reduced to suppress deformation, a crack or a short circuit of the ring shaped part 42R.

Thereafter, raw material gas controlled at a predetermined flowrate is introduced into the process chamber 14 through the gas introduction pipe 23. The introduced raw material gas circulates in the process chamber 14, is discharged from the top opening of the inner tube 13 into the exhaust passage 18, and then, is exhausted from the exhaust pipe 17. When the raw material gas passes through the inside of the process chamber 14, the raw material gas is in contact with the surface of the wafer 1, and, at this time, the wafer 1 is processed, so that a thin film is deposited on the surface of the wafer 1, for example, by a thermal CVD reaction.

After a preset process time is elapsed, inert gas is supplied from an inert gas supply source (not shown), and gas in the process chamber 14 is replaced with the inert gas. Simultaneously, the inside of the process chamber 14 returns to a normal pressure. In addition, the operation of the rotary mechanism 25 is stopped.

After that, the seal cap 20 is moved downward by the boat elevator 21 to open the lower end of the manifold 16, and simultaneously, the boat 22 holding the processed wafers 1 is unloaded from the lower end of the manifold 16 to the outside of the process tube 11 (boat unloading). After that, the processed wafers 1 are discharged from the boat 22 (wafer discharging).

(4) Effects Relevant to the Current Embodiment

According to the current embodiment, at least one of effects (a) to (e) is attained as follows.

(a) At the end (the bottom part of the valley part) of each of the valley parts 42b installed at the upper and lower ends of the ring shaped part 42R relevant to the current embodiment, the holding body receiving part 42c formed as a cutout part is installed. The width (the first width 'a') of the holding body receiving part 42c is greater than the width (the second width 'b') of the valley part 42b. The ring shaped part 42R is fixed by the couple of power feeding parts 45 and 46 penetrating the side wall of the insulating body 33, and simultaneously, the ring shaped part 42R is held to the inner circumferential surface of the insulating body 33 by the respective valley parts 42b independently fixed to the inner circumferential surface of the insulating body 33 through the holding bodies 41. The holding bodies 41 are configured to be respectively disposed in the holding body receiving parts 42c, and fixed to the insulating body 33.

When being heated, the ring shaped part 42R having a meander shape tends to grow along the circumferential direction by thermal expansion. In addition, when a growth amount of the ring shaped part 42R along the circumferential direction is greater than a predetermined amount, and a movement value is zero, plastic stress is added to each part of the ring shaped part 42R, so that the ring shaped part 42R may be deformed. For example, the ring shaped part 42R may be deformed in the manner where the width (the second width of 'b') of the valley part 42b is decreased. According to the current embodiment, the width (the first width 'a') of the holding body receiving part 42c where the holding body 41 is disposed is greater than the width (the second width 'b') of the valley part 42b. Thus, even when the ring shaped part 42R is deformed to decrease the width (the second width 'b') of the valley part 42b, it is difficult that the holding body 41 and the ring shaped part 42R interfere with (contact) each other, so as to suppress shearing of the holding body 41.

If the holding body 41 is directly disposed in each of the valley parts 42b without installing the holding body receiving part 42c at the end of each of the valley parts 42b, the width (the second width 'b') of the valley part 42b is decreased, and the holding body 41 and the ring shaped part 42R interfere with (contact) each other, so that any one of the holding body 41 and the ring shaped part 42R may be damaged, or the holding body 41 may be fitted into the valley part 42b and sheared.

(b) In addition, according to the configuration as described above, a greater movement value along the circumferential direction of the ring shaped part 42R than that in the related art is secured. That is, a movement value along the circumferential direction of the ring shaped part 42R is secured to maximally reach a size corresponding to the width (the first width 'a') of the holding body receiving part 42c. As a result, even when the ring shaped part 42R is grown along the circumferential direction by thermal expansion, the interference (contact) between the ring shaped part 42R and the holding body 41 is suppressed, so that a case such as missing of the holding body 41 is suppressed. In addition, since the interference (contact) between the ring shaped part 42R and the holding body 41 is difficult, compressive stress affecting the ring shaped part 42R is reduced to suppress deformation, a crack or a short circuit of the ring shaped part 42R.

Figure 18A:
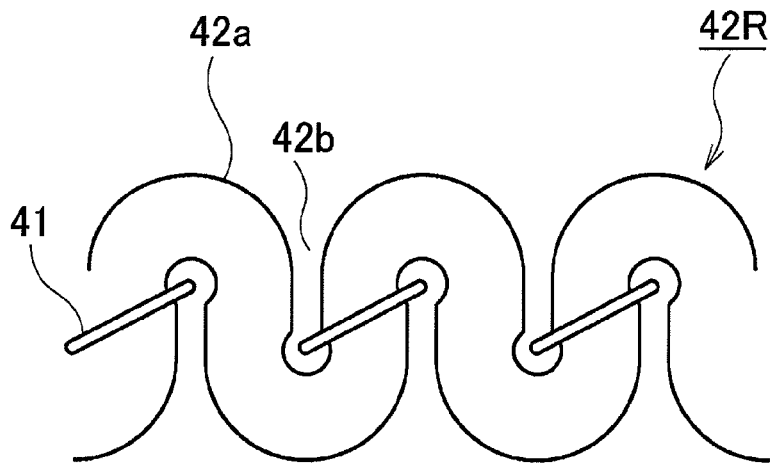
FIG. 18A and FIG. 18B are schematic views illustrating thermal deformation states of a heating element according to the first embodiment of the present invention, FIG. 18A illustrating a state before temperature is increased, FIG. 18B illustrating a state after temperature is increased.
Figure 18B:
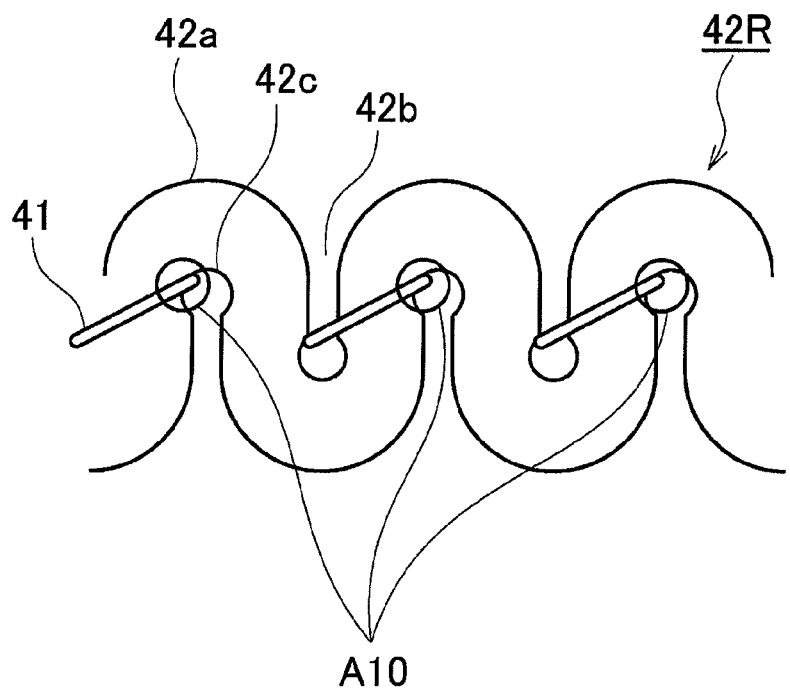

FIG. 18A and FIG. 18B are schematic views illustrating a thermal deformation state of a heating element according to the first embodiment of the present invention.

FIG. 18A is a schematic view illustrating thermal deformation of the heating element before temperature is increased, and FIG. 18B is a schematic view illustrating thermal deformation of the heating element after temperature is increased. Referring to FIG. 18A and FIG. 18B, as shown in regions A10, the holding body receiving parts 42c configured as cutout parts having a large width are provided to secure a great movement value along the circumferential direction of the ring shaped part 42R, and thus, the interference (contact) between the ring shaped part 42R and the holding body 41 is suppressed, so that a case such as missing of the holding body 41 is suppressed. In addition, compressive stress affecting the ring shaped part 42R is reduced to suppress deformation, a crack or a short circuit of the ring shaped part 42R. As described above, even when the ring shaped part 42R is deformed, by disposing the holding body 41 in the holding body receiving part 42c, it is difficult that the holding body 41 is fitted into the valley part 42b, so that breakage or shearing of the holding body 41 is suppressed.

For reference, thermal deformation of a heating element without the holding body receiving part 42c will now be described with reference to FIG. 17.

Figure 17A:
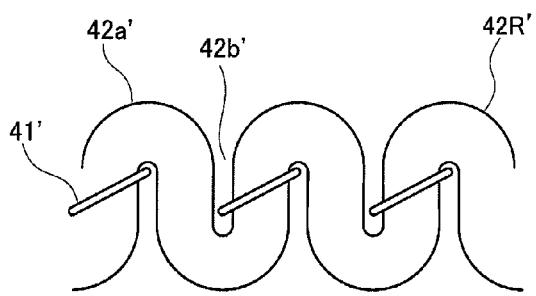
FIG. 17A, FIG. 17B, FIG. 17C, and FIG. 17D are partial enlarged views illustrating temperature deformation states of a ring shaped part without a holding body receiving part, FIG. 17A illustrating a state before temperature is increased, FIG. 17B illustrating a state after temperature is increased, FIG. 17C illustrating a state where shearing of a holding body, a split of the ring shaped part, and a short circuit of the ring shaped part are caused by thermal deformation, FIG. 17D illustrating a state where missing of the holding body is caused by thermal deformation.
Figure 17B:
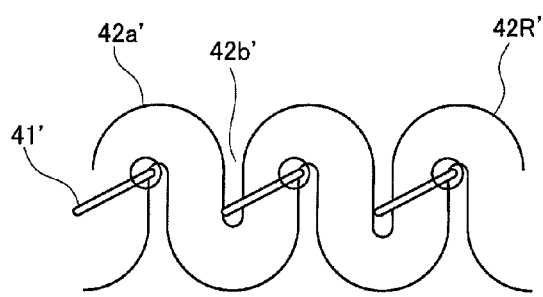

FIG. 17A is a schematic view illustrating a ring shaped part 42R' without the holding body receiving part 42c before temperature is increased. Respectively at the upper and lower ends of the ring shaped part 42R', a mountain part 42a' and a valley part 42b' are alternately connected in plurality, in which the ring shaped part 42R' has a meander shape (wave shape). The respective valley parts 42b' are independently fixed to an inner circumferential side wall of an insulating body (not shown) by holding bodies 41', so that the ring shaped part 42R' is held to the inner circumferential side of the insulating body. The holding bodies 41' are directly disposed in the valley parts 42b'. FIG. 17B is a schematic view illustrating the ring shaped part 42R' after temperature is increased. As described above, the ring shaped part 42R' having a meander shape is grown along the circumferential direction by thermal expansion. FIG. 17B is a schematic view illustrating a state where a growth amount along the circumferential direction of the ring shaped part 42R' is greater than a predetermined amount, so that a movement value along the circumferential direction of the ring shaped part 42R' is zero (the holding body 41' interferes with the ring shaped part 42R').

Figure 17C:
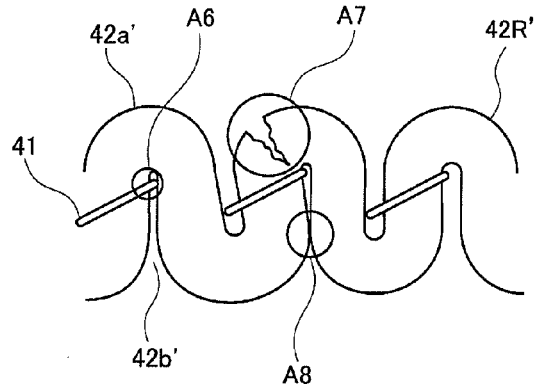
Figure 17D:
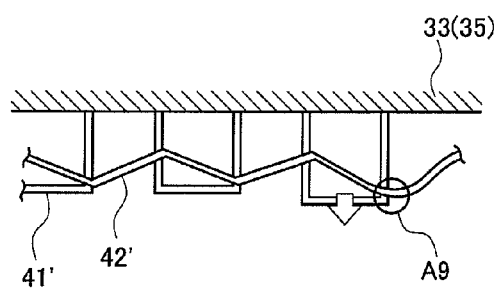

The ring shaped part 42R' is further grown to be in the state shown in FIG. 17C. FIG. 17C is a schematic view illustrating a state where shearing of the holding body 41', a split of the ring shaped part 42R', and a short circuit of the ring shaped part 42R' are caused by thermal deformation. As described above, when a growth amount along the circumferential direction is greater than a predetermined amount, the holding body 41' interferes with the ring shaped part 42R', and plastic stress is added to the ring shaped part 42R', so that the ring shaped part 42R' is deformed. In a region A6, the holding body 41' is fitted into both sides of the valley part 42b' and sheared. In a region A7, the ring shaped part 42R' is split. In a region A8, a short circuit occurs at the ring shaped part 42R'. FIG. 17D is a side view illustrating the ring shaped part 42R' shown in FIG. 17C, and missing of the holding body 41' due to thermal deformation. In a region A9, due to the deformation of the ring shaped part 42R', the holding body 41' is pulled from the insulating body just before removal.

(c) According to the current embodiment, the outer circumferential surface of the ring shaped part 42R and the inner circumferential surface of the side wall part 35 are spaced a predetermined distance (the third width 'c') from each other without contact, and are fixed, as shown in FIG. 19B.

According to the configuration as described above, a movement value having a predetermined size along the radial direction of the ring shaped part 42R is secured. That is, the ring shaped part 42R is fixed in the state where a movement value corresponding maximally to the third width 'c' along the radial direction of the ring shaped part 42R is secured. As a result, even when the ring shaped part 42R is grown along the radial direction by thermal expansion, if a relevant growth amount is less than the above-described movement value (maximally the third width 'c'), the contact between the ring shaped part 42R and the inner circumferential wall of the insulating body 33 is suppressed. In addition, since a local temperature increase (abnormal temperature increase) of the ring shaped part 42R or meltdown of the ring shaped part 42R can be suppressed, the service life of the ring shaped part 42R or the insulating body 33 can be increased. In addition, a uniform temperature distribution can be achieved in the process chamber 14.

(d) According to the current embodiment, by increasing the width of the end (the bottom part of the valley) of each of the valley parts 42b installed at the upper and lower ends of the ring shaped part 42R, the holding body receiving part 42c is formed, so that at least one of the above-described effects can be attained. That is, without significantly reducing the surface area (heating area) of the ring shaped part 42R (without degrading the heating performance of the heater unit 30), at least one of the above-described effects can be attained.

(e) According to the current embodiment, by increasing the width of the end (the bottom part of the valley) of each of the valley parts 42b, the holding body receiving part 42c is formed, so that dispersion in a current density can be achieved at the end (the bottom part of the valley) of each of the valley parts 42b, thus increasing the service life of the ring shaped part 42R. In addition, since a temperature difference in the ring shaped part 42R is decreased, the temperature uniformity of a substrate when processing the substrate can be improved.

Figure 20:
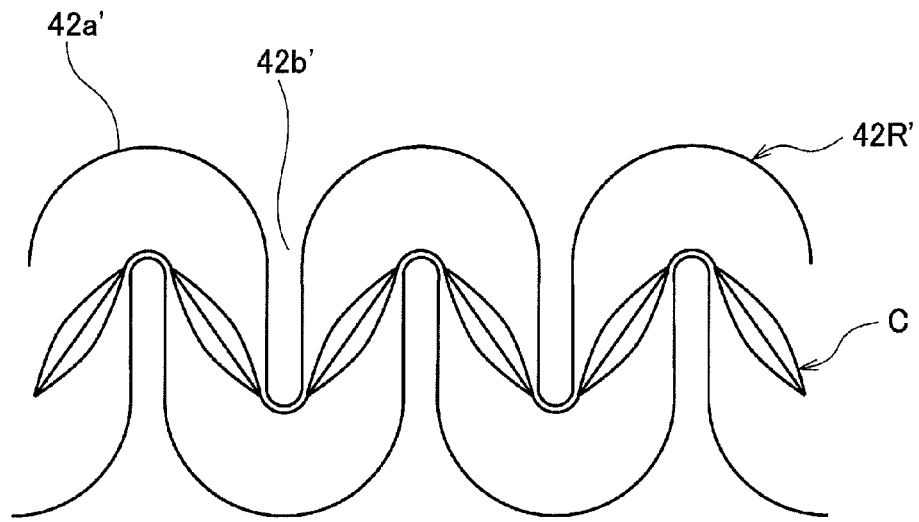
FIG. 20 is a schematic view illustrating a current path in a ring shaped part without a holding body receiving part.
Figure 21:
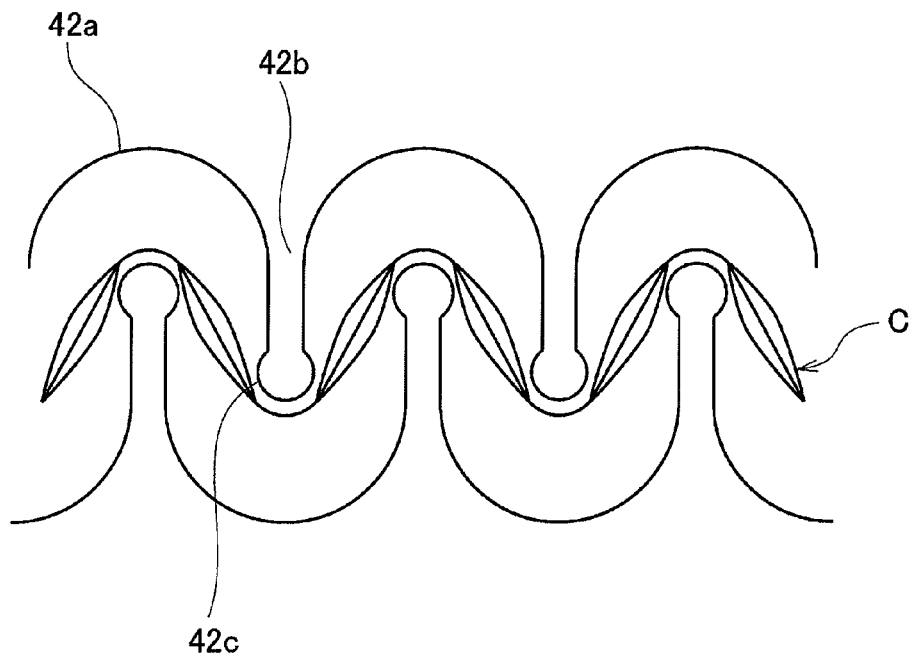
FIG. 21 is a schematic view illustrating a current path in a heating element according to the first embodiment of the present invention.

FIG. 20 is a schematic view illustrating a current path C in the ring shaped part 42R' without a holding body receiving part, and FIG. 21 is a schematic view illustrating a current path C in the ring shaped part 42R according to the first embodiment of the present invention.

As shown in FIG. 20, at the end of the valley part 42b' (at the bottom part of the valley), an electric current flows in a quick curve shape. That is, at the end of the valley part 42b' (at the bottom part of the valley), a current density is increased, and the amount of heat is increased comparing to the other portions except for the end, so that local temperature increase can easily occur. If a temperature difference in the ring shaped part 42R' is increased, plastic stress is added to the ring shaped part 42R' by the difference in thermal expansion amounts, so that the ring shaped part 42R' may be deformed and broken.

As shown in FIG. 21, the holding body receiving part 42c having a large diameter is installed at the end of the valley part 42b (at the bottom part of the valley), and an electric current flows in a relatively gentle curve shape at the end of the valley part 42b. That is, at the end of the valley part 42b (at the bottom part of the valley), a current density can be decreased comparing to the case of FIG. 20, so that a difference in the amount of heat between the end and the other parts is decreased to suppress a local temperature increase. When a temperature difference in the ring shaped part 42R is decreased, plastic stress affecting the ring shaped part 42R is decreased by the difference in thermal expansion amounts, so that deformation or breakage of the ring shaped part 42R is suppressed. In addition, since a temperature difference in the ring shaped part 42R is decreased, the temperature uniformity of a substrate when processing the substrate can be improved.

Preferably, the holding body receiving part 42c may have an oval shape. According to this configuration, the density can be further dispersed. In addition, the strength of surroundings of the holding body receiving part 42c can be increased. In addition, the area of the heating element 42 can be increased.

(6) Modified Example

Hereinafter, a modified example of the current embodiment will now be described.

Modified Example

The holding body receiving part 42c relevant to the present invention is not limited to an oval shape as in the above-described embodiment, and thus, a circular shape having a greater diameter than the width (the second width 'b') of the valley part 42b (circular shape having a diameter equal to the first width 'a') may be formed as a cutout part. FIG. 22A is a partial enlarged view illustrating the ring shaped part 42R according to the modified example of the first embodiment of the present invention, and FIG. 22B is a side view illustrating an enlarged part of FIG. 22A.

According to the current modified example, a greater movement value along the vertical direction of the ring shaped part 42R than that in the related art is secured. That is, a movement value along the vertical direction of the ring shaped part 42R is secured to maximally reach a size corresponding to the diameter (the first width 'a') of the holding body receiving part 42c. As a result, even when the ring shaped part 42R is misaligned along the vertical direction by thermal expansion, if a relevant deviation amount is less than the above-described movement value (maximally the first width 'a.'), the interference (contact) between the ring shaped part 42R and the holding body 41 is suppressed. As a result, a case such as missing of the holding body 41 is suppressed. In addition, compressive stress affecting the ring shaped part 42R is reduced to suppress deformation, a crack or a short circuit of the ring shaped part 42R.

In addition, according to the current modified embodiment, since the holding body receiving part 42c has, as a cutout part, a circular shape having a greater diameter than the width (the second width 'b') of the valley part 42b (circular shape having a diameter equal to the first width 'a.'), new dispersion in a current density can be achieved at the end of each of the valley parts 42b (at the bottom part of the valley). That is, an electric current flows in a more gentle curve at the end of each of the valley parts 42b, and deformation or breakage of the ring shaped part 42R is further suppressed to make temperatures conducted to a substrate uniform, so that the temperature uniformity in processing a substrate can be further improved.

Another Modified Example

According to a study of the inventors, when the couple of power feeding parts 45 and 46 are fixed to the insulating body 33, a position deviation amount of each portion of the ring shaped part 42R due to thermal expansion is accumulated and increased as it goes away from the couple of power feeding parts 45 and 46. In this case, a movement value of the ring shaped part 42R may not be identical along the entire circumference of the ring shaped part 42R, and may be appropriately adjusted according to a position deviation amount or a position variation direction. In the current modified example, instead of making the width (or diameter) of the holding body receiving part 42c identical along the entire circumference of the ring shaped part 42R, the width (or diameter) of the holding body receiving part 42c is locally varied according to a position deviation amount or a position variation direction. For example, the width of the holding body receiving part 42c is set to increase as it goes away from the couple of power feeding parts 45 and 46.

Figure 23A:
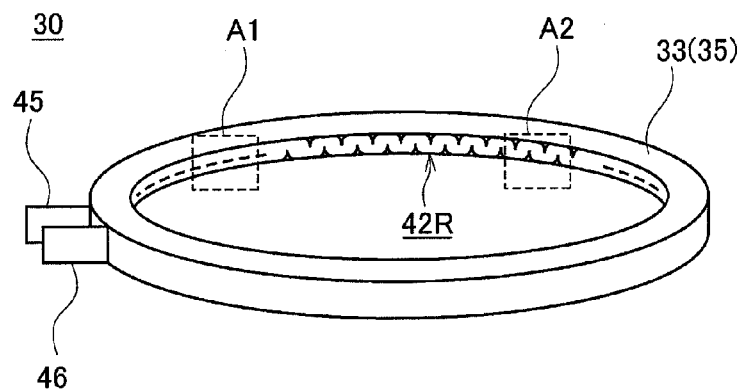
FIG. 23A is a partial enlarged view illustrating the heater unit according to the modified example of the first embodiment of the present invention.
Figure 23B:
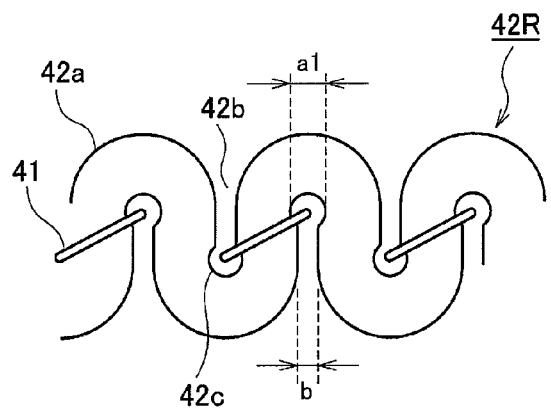
FIG. 23B is a partial enlarged view illustrating a region A1 of the ring shaped part.
Figure 23C:
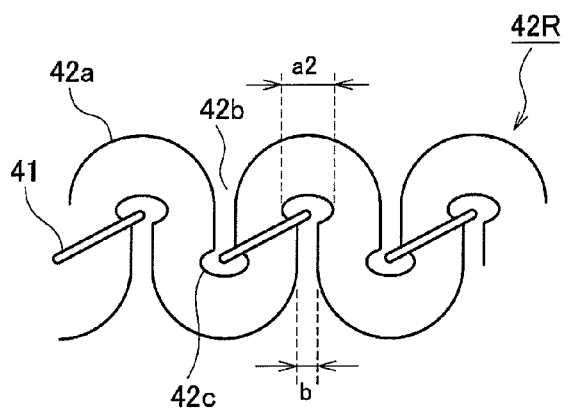
FIG. 23C is a partial enlarged view illustrating a region A2 of the ring shaped part.

FIG. 23A is a partial enlarged view illustrating the heater unit 30 according to the modified example of the first embodiment of the present invention, and FIG. 23B is a partial enlarged view illustrating a region A1 of the ring shaped part 42R of FIG. 23A, and FIG. 23C is a partial enlarged view illustrating a region A2 of the ring shaped part 42R of FIG. 23A. As shown in FIG. 23A, FIG. 23B and FIG. 23C, the width (a first width a2) of the holding body receiving part 42c in a region (for example, the region A2) away from the couple of power feeding parts 45 and 46 is set to be greater than the width (a first width a1) of the holding body receiving part 42c in a region (for example, the region A1) close to the couple of power feeding parts 45 and 46.

According to the current modified example, a necessary movement value of each part of the ring shaped part 42R is independently secured to suppress the interference (contact) between the ring shaped part 42R and the holding body 41, and an unnecessary movement value of each part of the ring shaped part 42R is independently decreased to improve the stability in holding the ring shaped part 42R. In FIG. 7A, FIG. 7B and FIG. 7C, if the width of the holding body receiving part 42c is set uniformly to the first width a2 along the entire circumference of the ring shaped part 42R, a growth value of the ring shaped part 42R close to the couple of power feeding parts 45 and 46 excessively increases, so that holding of the ring shaped part 42R is unstable. In addition, if the width of the holding body receiving part 42c is set uniformly to the first width a1 along the entire circumference of the ring shaped part 42R, a growth value of the ring shaped part 42R away from the couple of power feeding parts 45 and 46 excessively decreases, so that interference (contact) between the ring shaped part 42R and the holding body 41 easily occurs, and thus, elastic stress is easily added to the ring shaped part 42R.

In addition, according to the current modified example, the sizes respectively of the holding body receiving parts 42c are set to the bare minimums without unnecessarily decreasing the surface area (heating area) of the ring shaped part 42R, so that the degradation in heating performance of the heater unit 30 can be suppressed.

For reference, thermal deformation of the ring shaped part 42R will now be described with reference to FIG. 8 and FIG. 9.

FIG. 8 is a schematic view illustrating expansion directions of the ring shaped part 42R. As shown in FIG. 8, since the couple of power feeding parts 45 and 46 are fixed to the insulating body 33, each portion of the ring shaped part 42R independently expands not in a concentric circle, but in each arrow direction in the drawing from a region (a region A1) close to the couple of power feeding parts 45 and 46, as a base point. Thus, a position deviation amount of each portion of the ring shaped part 42R is accumulated and increased as it goes away from the couple of power feeding parts 45 and 46.

Figure 9:
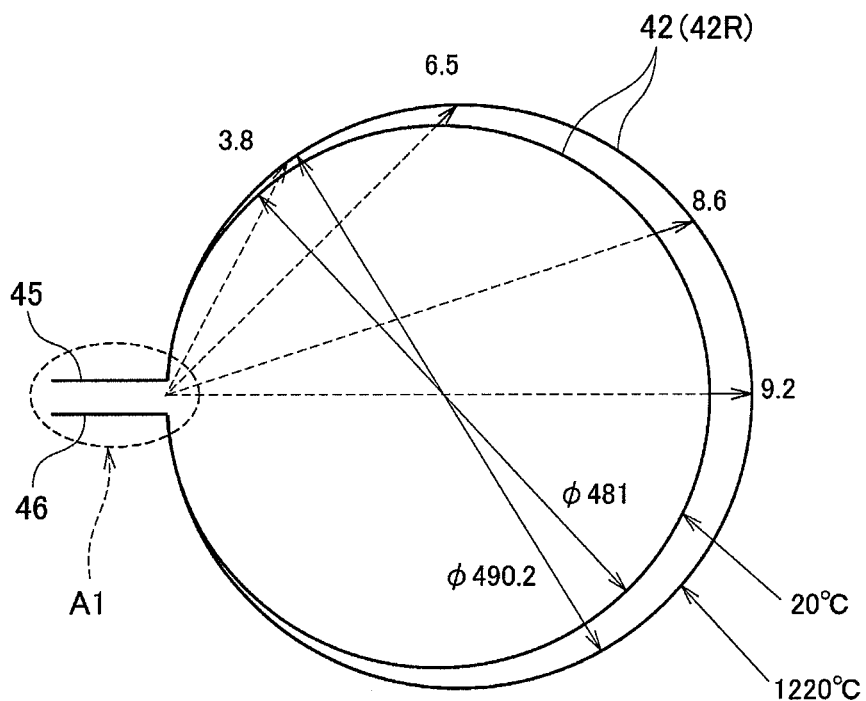
FIG. 9 is a schematic view illustrating the result of measurement relevant to thermal expansion of a ring shaped part.

FIG. 9 is a schematic view illustrating the result of measurement relevant to thermal expansion of the ring shaped part 42R. In the measurement shown in FIG. 9, the ring shaped part 42R was formed using Kanthal APM (registered trade mark), which has a coefficient of linear expansion of $15 \times 10^{-6}$ at a temperature ranging from 20° C. to 1220° C. At a temperature of 20° C., the diameter of the ring shaped part 42R was 481 mm. In the state where a region close to the couple of power feeding parts 45 and 46 was fixed, the temperature of the ring shaped part 42R was increased from 20° C. to 1220° C. Diameter growth amount due to the temperature increase=(Length of the ring shaped part 42R)×(1220−20)×$15 \times 10^{-6}$ mm, and the diameter of the ring shaped part 42R was 490.2 mm at a temperature of 1220° C. As shown in FIG. 9, position deviation amounts respectively of portions of the ring shaped part 42R gradually increased as it went away from the couple of power feeding parts 45 and 46 (were 3.8 mm, 6.5 mm, and 8.6 mm from the region A1 as a base point), and the farthest portion from the couple of power feeding parts 45 and 46 was the maximum (9.2 mm). At the farthest place from the couple of power feeding parts 45 and 46, a position deviation along the circumferential direction almost does not occur, and a position deviation along only the radial direction occurs. Thus, at the farthest place from the couple of power feeding parts 45 and 46, it may be unnecessary to increase the width of the holding body receiving part 42c as shown in FIG. 23C.

Further Another Modified Example

In the current modified example, a relative position between the holding body receiving part 42c and the holding body 41 is set to be varied in at least one portion of the entire circumference of the ring shaped part 42R. That is, instead of locally varying the width of the holding body receiving part 42c, the position of the holding body 41 disposed in the holding body receiving part 42c is adjusted to locally vary a movement value along the circumferential direction of the ring shaped part 42R.

Figure 24A:
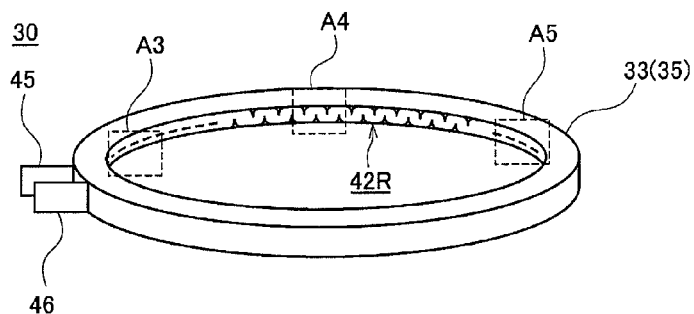
FIG. 24A is a partial enlarged view illustrating the heater unit according to the modified example of the first embodiment of the present invention.
Figure 24B:
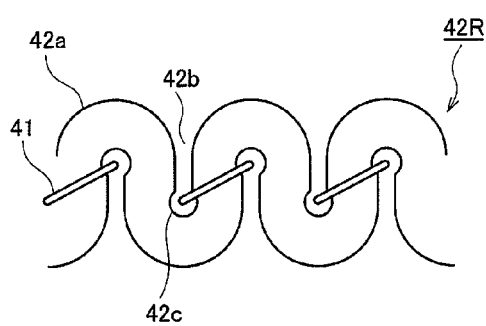
FIG. 24B is a partial enlarged view illustrating a region A3 of the ring shaped part.
Figure 24C:
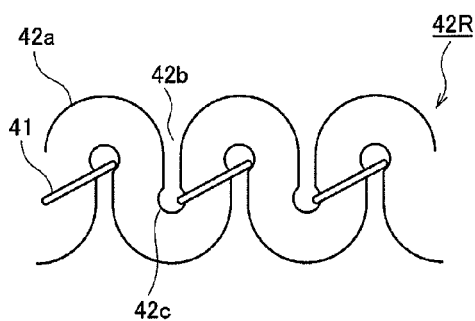
FIG. 24C is a partial enlarged view illustrating a region A4 of the ring shaped part.
Figure 24D:
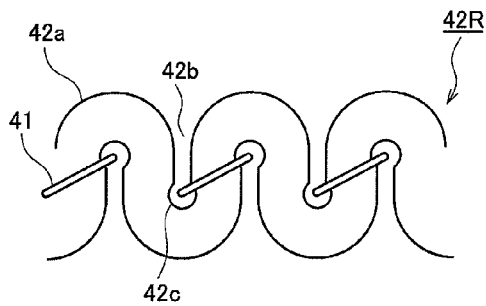
FIG. 24D is a partial enlarged view illustrating a region A5 of the ring shaped part.

FIG. 24A is a partial enlarged view illustrating the heater unit 30 according to the modified example of the first embodiment of the present invention. FIG. 24B is a partial enlarged view illustrating a region A3 of the ring shaped part of FIG. 24A. FIG. 24C is a partial enlarged view illustrating a region A4 of the ring shaped part of FIG. 24A. FIG. 24D is a partial enlarged view illustrating a region A5 of the ring shaped part of FIG. 24A.

As shown in FIG. 24B, since a movement value along the circumferential direction of the ring shaped part 42R is desirably minimized in the region A3 (near the couple of power feeding parts 45 and 46), the end of the holding body 41 is disposed at the center of the holding body receiving part 42c. In this case, the movement value along the circumferential direction of the ring shaped part 42R in the region A3 is about half the width (the first width 'a') of the holding body receiving part 42c.

In addition, as shown in FIG. 24C, since a movement value along the circumferential direction of the ring shaped part 42R is necessary at the region A4 (at a place away from the couple of power feeding parts 45 and 46), the end of the holding body 41 is disposed not at the center of the holding body receiving part 42c, but at a dislocated position out of the center of the holding body receiving part 42c. By dislocating the end of the holding body 41 to the edge of the holding body receiving part 42c, a movement value along the circumferential direction of the ring shaped part 42R can be secured maximally to the first width 'a.').

In addition, as shown in FIG. 24D, since a movement value along the circumferential direction of the ring shaped part 42R is desirably minimized in the region A5, the end of the holding body 41 is disposed at the center of the holding body receiving part 42c. As described above, this is because, at the region A5 (at the farthest place from the couple of power feeding parts 45 and 46), a position deviation along the circumferential direction almost does not occur, and a large position deviation along only the radial direction occurs. In this case, the movement value along the circumferential direction of the ring shaped part 42R in the region A5 is about half the width (the first width 'a') of the holding body receiving part 42c as in the case of FIG. 24B.

According to the current modified example, a necessary movement value of each portion of the ring shaped part 42R is independently secured to suppress the interference (contact) between the ring shaped part 42R and the holding body 41, so that plastic stress affecting the ring shaped part 42R can be suppressed. In addition, an unnecessary movement value of each portion of the ring shaped part 42R is reduced to improve the stability in holding the ring shaped part 42R. In addition, since it is desirable that the sizes of the holding body receiving parts 42c are uniform along the entire circumference of the ring shaped part 42R, manufacturing costs of the ring shaped part 42R can be reduced.

Second Embodiment

A second embodiment of the present invention will be described hereinafter with reference to the attached drawings.

Figure 25:
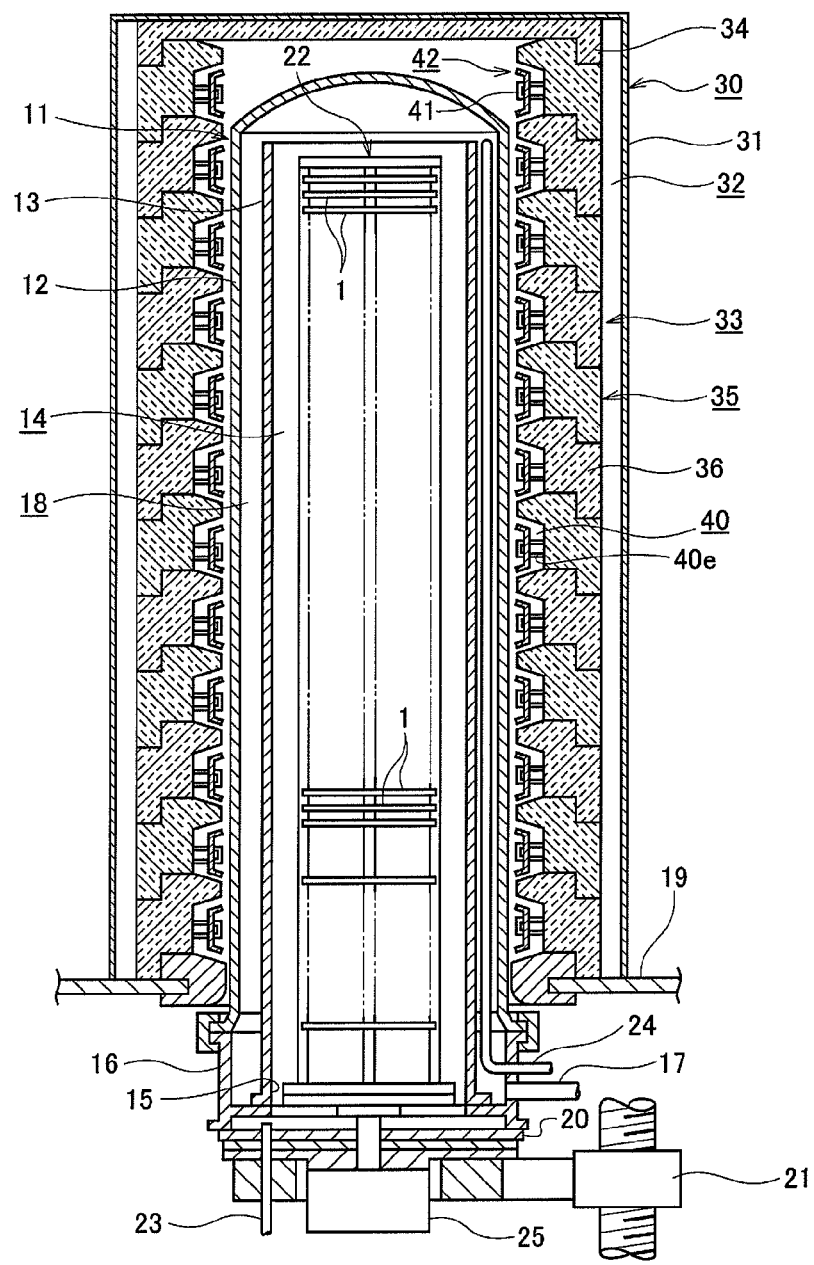
FIG. 25 is a vertical cross-sectional view illustrating a substrate processing apparatus according to the second embodiment of the present invention.
Figure 26:
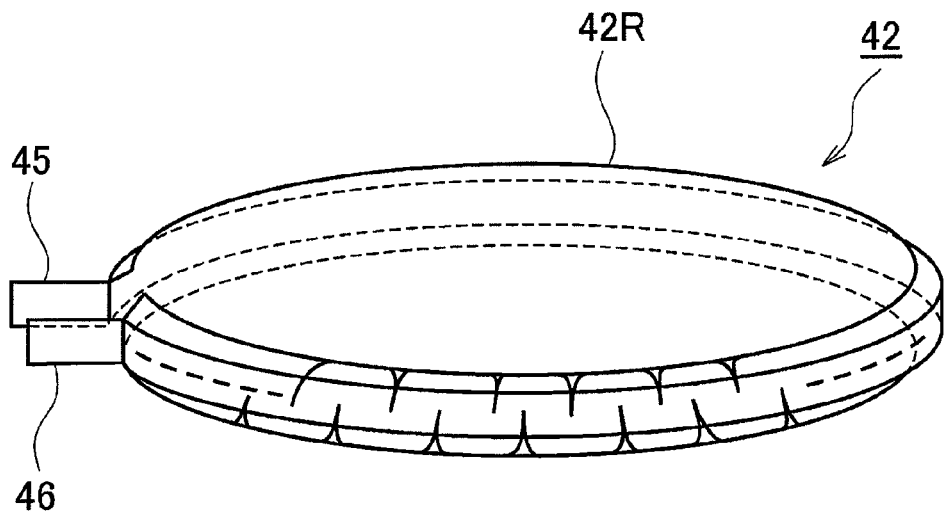
FIG. 26 is a perspective view illustrating a heating element according to the second embodiment of the present invention.
Figure 28A:
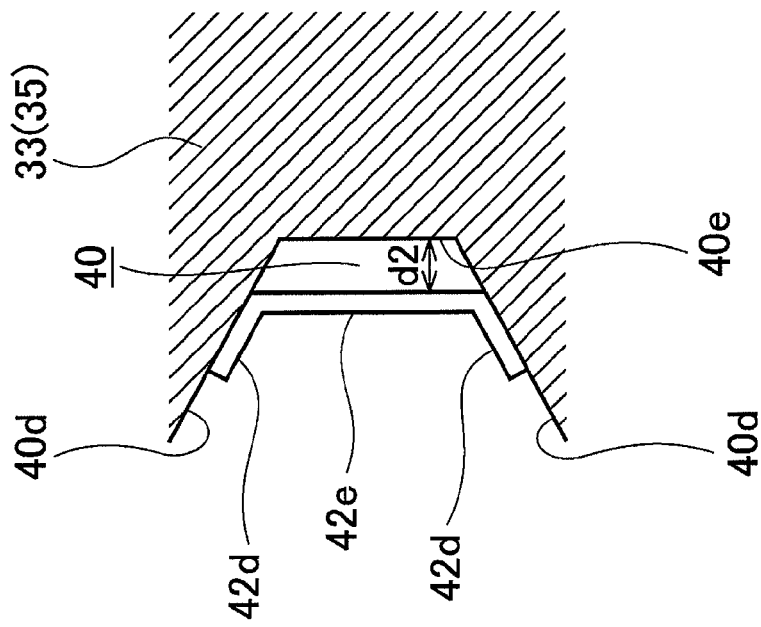
FIG. 28A and FIG. 28B are partial enlarged views illustrating an insulating body holding the ring shaped part according to the second embodiment of the present invention, FIG. 28A illustrating a state before temperature is increased, FIG. 28B illustrating a state after temperature is increased.
Figure 28B:
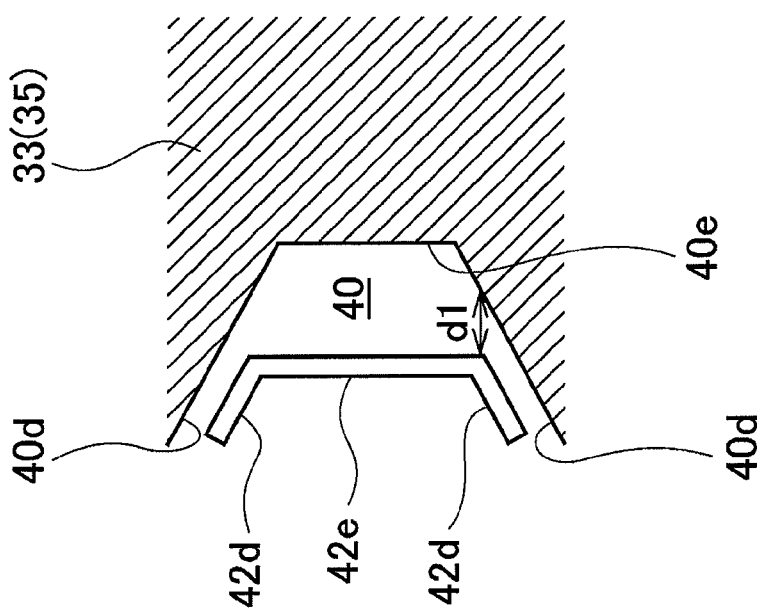

FIG. 25 is a vertical cross-sectional view illustrating a substrate processing apparatus according to the second embodiment of the present invention. FIG. 26 is a perspective view illustrating a heating element according to the second embodiment of the present invention. FIG. 27A is a partial enlarged view illustrating a ring shaped part according to the second embodiment of the present invention, and FIG. 27B is a side view illustrating an enlarged part of FIG. 27A. FIG. 28A and FIG. 28B are partial enlarged views illustrating an insulating body holding the ring shaped part according to the second embodiment of the present invention, FIG. 28A illustrating a state before temperature is increased, FIG. 28B illustrating a state after temperature is increased.

(1) Configurations of Heating Element and Insulating Body

In the substrate processing apparatus relevant to the current embodiment, configurations of the heating element 42 and the insulating body 33 are different from those of the above-described embodiment. The other configurations are the same as those of the above-described embodiment.

In the same manner as in the above-described embodiment, the heating element 42 relevant to the current embodiment includes the ring shaped part 42R formed at a place where the mountain part 42a and the valley part 42b are alternately connected in plurality, and the couple of power feeding parts 45 and 46 penetrating the insulating body 33 and fixed to the insulating body 33 and respectively connected to both ends of the ring shaped part 42R. The ring shaped part 42R relevant to the current embodiment is different from that of the above-described embodiment in that, as shown in FIG. 26, FIG. 27A, and FIG. 27B, to direct front ends 42d of the mountain parts 42a of the ring shaped part 42R to the center of the ring shaped part 42R, the front ends 42d are respectively inclined at obtuse angles from a middle part 42e except for the front ends 42d of the mountain parts 42a of the ring shaped part 42R.

The insulating body 33 relevant to the current embodiment, in the same manner as in the above-described embodiment, has a tube shape in the manner of surrounding the outer circumferential surface of the ring shaped part 42R. The insulating body 33 relevant to the current embodiment is different from that of the above-described embodiment in that, as shown in FIG. 5, FIG. 28A, and FIG. 28B, a storage part 40 having a groove shape accommodating the ring shaped part 42R is installed in the inner circumferential surface of the insulating body 33. The storage part 40 having a groove shape is provided in plurality, and the storage parts 40 are vertically arrayed to respectively correspond to the ring shaped parts 42R.

The inner diameter (horizontal diameter) of a bottom surface 40e of the storage part 40 is configured to be greater than the outer shape (horizontal diameter) of the ring shaped part 42R. The vertical width of an opening part of the storage part 40 is configured to be greater than the vertical width of the ring shaped part 42R including the mountain part 42a. The vertical width of the bottom surface 40e of the storage part 40 is configured to be less than the vertical width of the middle part 42e except for the front ends of the mountain part 42a of the ring shaped part 42R. Both side walls (a couple of side walls on upper and lower sides) 40d of the storage part 40 are respectively inclined at obtuse angles from the bottom surface 40e of the storage part 40 having a groove shape. That is, the storage part 40 has a shape that gradually decreases in its vertical width as it goes outward along the radial direction of the insulating body 33 having a cylindrical shape (in the opposite direction to the centripetal direction of the cylindrical shape) (as it comes closer to the bottom surface 40e). In other words, both the side walls 40d of the storage part 40 are formed as tapered surfaces, and the distance between both the side walls 40d decreases as it comes closer to the bottom surface 40e.

The side wall parts 35 of the holding bodies 33 are configured by vertically stacking a plurality of insulating blocks 36 having, for example, doughnut shapes. The insulating blocks 36 and the top wall part 34 is made of an insulating material, for example, such as alumina ($Al_2O_3$) or silica ($SiO_2$) having a fiber shape or a sphere shape. The insulating block 36 is integrally formed using a method, for example, such as a vacuum foam method. As such, since the side wall part 35 of the insulating body 33 is configured by the plurality of insulating blocks 36, the formation of the storage parts 40 having a groove shape or the assembly of the heater unit 30 is facilitated, and simultaneously, the breakage of the side wall part 35 (the insulating blocks 36) when stress is added to the side wall part 35 can be suppressed. In addition, a part of the heating elements 42 or a part of the insulating blocks 36 stacked in multi stages is conveniently taken out for exchanging or maintenance. However, the side wall part 35 is not limited to the above configuration, and thus, may be integrally formed. In addition, the insulating blocks 36 are not limited to the integrally formation, and thus, may be configured by a plurality of insulating materials having doughnut shapes.

Inclination angles of the front ends 42d of the mountain part 42a of the ring shaped part 42R are set to be identical to inclination angles of both the side walls 40d of the storage part 40. That is, the front ends 42d of the mountain part 42a are approximately parallel to both the side walls 40d of the storage part 40. In addition, as shown in FIG. 28A, when the ring shaped part 42R is in a state before temperature is increased (at least in a room temperature state), the front ends 42d of the mountain part 42a are maintained to be spaced a predetermined distance d1 from the side walls 40d of the storage part 40 without contact. In addition, as shown in FIG. 28B, when the temperature of the ring shaped part 42R is increased, and the ring shaped part 42R grows along the radial direction, the front ends 42d of the mountain part 42a are in surface contact with the side walls 40d of the storage part 40, respectively. At this time, the middle part 42e except for the front ends of the mountain parts 42a of the ring shaped part 42R are maintained to be spaced a predetermined distance d2 from the bottom surface 40e of the storage part 40 without contact.

(2) Effects Relevant to the Current Embodiment

According to the current embodiment, one or more effects are attained as follows.

(a) According to the current embodiment, the inclination angles of the front ends 42d of the mountain parts 42a of the ring shaped part 42R are set to be identical to the inclination angles of the side walls 40d of the storage part 40. That is, the front ends 42d of the mountain parts 42a are approximately parallel to both the side walls 40d of the storage part 40. In addition, when the temperature of the ring shaped part 42R is increased, and the ring shaped part 42R grows along the radial direction, the front ends 42d of the mountain parts 42a are in surface contact with the side walls 40d of the storage part 40, respectively. As a result, adding of compressive stress to the ring shaped part 42R is difficult to suppress deformation of the ring shaped part 42R.

(b) According to the current embodiment, when the temperature of the ring shaped part 42R is increased, and the ring shaped part 42R grows along the radial direction, the middle part 42e except for the front ends of the mountain parts 42a of the ring shaped part 42R are maintained to be spaced the predetermined distance d2 from the bottom surface 40e of the storage part 40 without contact. In addition, a local temperature increase (abnormal temperature increase) of the ring shaped part 42R or meltdown of the ring shaped part 42R due to contact of the ring shaped part 42R with the insulating body 33 can be prevented, and the service life of the ring shaped part 42R or the insulating body 33 can be increased. In addition, a uniform temperature distribution can be achieved in the process chamber 14.

(3) Modified Example

In the above-described embodiment, the vertical width of the bottom surface 40e of the storage part 40 is less than the vertical width of the middle part 42e except for the front ends of the mountain parts 42a of the ring shaped part 42R, but the present invention is not limited thereto. For example, the vertical width of the bottom surface 40e of the storage part 40 may be greater than the vertical width of the middle part 42e except for the front ends of the mountain part 42a of the ring shaped part 42R to provide the bottom surface 40e of the storage part 40 with a stepped part having a width less than the vertical width of the middle part 42e.

FIG. 29A and FIG. 29B are schematic views illustrating a modified example of the storage part according to the second embodiment of the present invention, FIG. 29A being a partial enlarged view illustrating the storage part configured to accommodate the ring shaped part, FIG. 29B being a side view illustrating an enlarged part of FIG. 29A. As shown in FIG. 29A and FIG. 29B, a vertical width E2 of the bottom surface 40e of the storage part 40 is set to be greater than a vertical width E1 of the middle part 42e except for the front ends of the mountain part 42a of the ring shaped part 42R. In addition, in the bottom surface 40e of the storage part 40, a stepped part 40f having a width less than the vertical width E1 of the middle part 42e is installed.

According to the current modified example, even when the temperature of the ring shaped part 42R is increased, the ring shaped part 42R grows along the radial direction, and the distance d2 between the middle part 42e except for the front ends of the mountain part 42a of the ring shaped part 42R and the bottom surface 40e of the storage part 40 is zero, the middle part 42e contacts only the stepped part 40f so as to decrease the contact area between the middle part 42e and the bottom surface 40e. As a result, a local temperature increase (abnormal temperature increase) of the middle part 42e or melt of the middle part 42e can be prevented. Specifically, by bringing the stepped part 40f to contact with a region of the middle part 42e having low current density, a local temperature increase (abnormal temperature increase) of the middle part 42e can be prevented more effectively.

Third Embodiment

A third embodiment of the present invention will be described hereinafter with reference to the attached drawings.

FIG. 6 is a horizontal cross-sectional view illustrating the heater unit 30 before temperature is increased, according to the third embodiment of the present invention. FIG. 7 is a horizontal cross-sectional view illustrating the heater unit 30 after temperature is increased, according to the third embodiment of the present invention.

In a substrate processing apparatus relevant to the current embodiment, as shown in FIG. 6, the distance between the bottom surface 40e and the middle part 42e is set to increase as it goes away from the couple of power feeding parts 45 and 46 at least when the ring shaped part 42R is at a room temperature (that is, at a room temperature, distances A, B, and C of FIG. 6 are set as A<B<C). In addition, as shown in FIG. 7, the distance between the bottom surface 40e and the middle part 42e is set to be identical along the entire circumferences of the storage part 40 and the ring shaped part 42R by thermal expansion at least when the ring shaped part 42R is at a substrate process temperature (that is, at a substrate process temperature, distances A, B, and C of FIG. 7 are set as A≈B≈C).

When temperature is increased, the ring shaped part 42R of the heating element 42 is thermally expanded or is extended along the radial direction and the circumferential direction. In addition, when, due to the extension along the radial direction of the ring shaped part 42R, the distance between the bottom surface 40e and the middle part 42e is uneven along the entire circumference of the ring shaped part 42R, uniformity in temperature distribution of the ring shaped part 42R may be degraded along the circumferential direction. That is, the temperature of the ring shaped part 42R may abnormally increase at a place where the bottom surface 40e is close to the middle part 42e, or the temperature of the ring shaped part 42R may decrease at a place where the bottom surface 40e is close to the middle part 42e. On the other hand, according to the current embodiment, when the ring shaped part 42R is at a substrate process temperature, the distances between the storage part 40 and the ring shaped part 42R are identical along the entire circumferences of the storage part 40 and the ring shaped part 42R by thermal expansion, so that the ring shaped part 42R can be uniformly heated along the circumferential direction of the ring shaped part 42R.

For reference, thermal deformation of the ring shaped part 42R will now be described with reference to FIG. 16A and FIG. 16B.

Figure 16A:
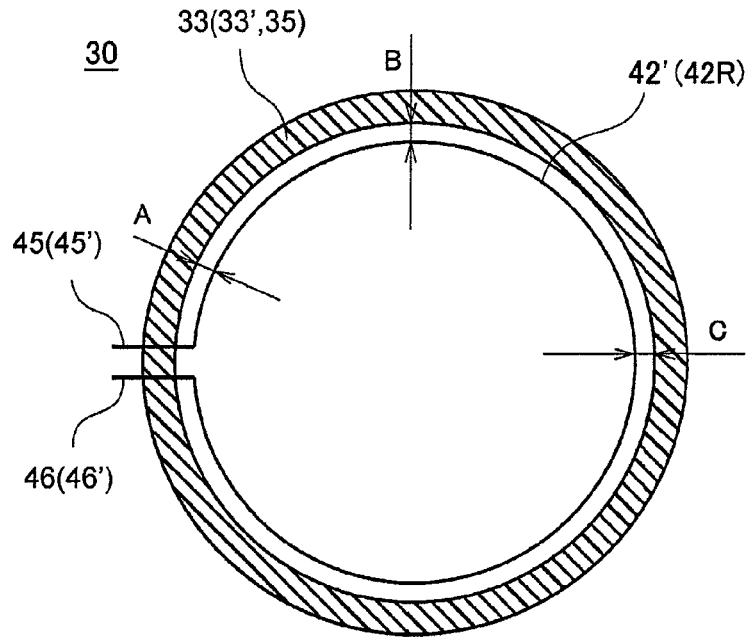
FIG. 16A and FIG. 16B are schematic views illustrating a thermal deformation state of a heating element in a case where the heating element and an insulating body have concentric circle shapes at a room temperature, FIG. 16A illustrating a state before temperature is increased, FIG. 16B illustrating a state after temperature is increased.
Figure 16B:
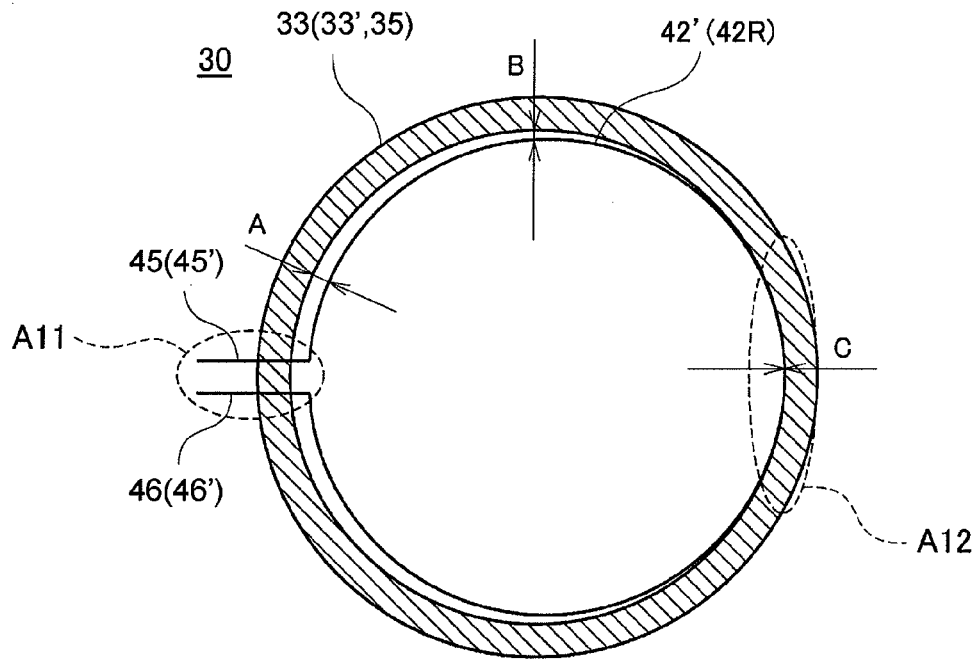

FIG. 16A and FIG. 16B are schematic views illustrating thermal deformation states of the ring shaped part 42R in the case where the storage part 40 and the ring shaped part 42R have concentric circle shapes at a room temperature, FIG. 16A illustrating a state before temperature is increased, FIG. 16B illustrating a state after temperature is increased. As shown in FIG. 16A, before temperature is increased, the distance between the bottom surface 40e and the middle part 42e is uniform along the entire circumference of the ring shaped part 42R. However, as shown in FIG. 16B, when the temperature of the ring shaped part 42R is increased to be a substrate process temperature, the ring shaped part 42R is extended along the diameter of the ring shaped part 42R, and the distances between the bottom surface 40e of the storage part 40 and the middle part 42e except for the front ends of the mountain part 42a of the ring shaped part 42R adjacent to the bottom surface 40e are uneven along the entire circumference of the ring shaped part 42R (distances A, B, and C of FIG. 16B are in a state of A>B>C). That is, since the couple of power feeding parts 45 and 46 are fixed to the insulating body 33, each portion of the ring shaped part 42R expands from a region (a region A11) close to the couple of power feeding parts 45 and 46, as a base point. In addition, the distance between the bottom surface 40e and the middle part 42e gradually decreases as it goes away from the couple of power feeding parts 45 and 46, and the distance between the bottom surface 40e and the middle part 42e is minimum (zero in the current case) in a region (a region A12) farthest from the couple of power feeding parts 45 and 46. As a result, a local temperature increase (abnormal temperature increase) of the ring shaped part 42R occurs to melt down the ring shaped part 42R. In addition, uniformity in temperature distribution of the ring shaped part 42R is degraded along the circumferential direction.

Other Embodiments of the Present Invention

The third embodiment of the present invention is not limited to the case where the holding body receiving part 42c formed as a cutout part at the end of the valley part 42b is installed as in the above-described embodiments. That is, as shown in FIG. 20, the present invention is very suitably applicable even to the case where the holding body receiving part 42c is not installed in the heating device including the heating element that has the ring shaped part 42R' formed at a place where the mountain part 42a' and the valley part 42b' are alternately connected in plurality, and that has the couple of power feeding parts 45 and 46 penetrating the insulating body 33 and fixed to the insulating body 33 and respectively connected to both ends of the ring shaped part 42R'. In addition, the present invention is very suitably applicable even to the case where a heating element has a ring shaped part without the mountain part 42a' and the valley part 42b' being alternately connected in plurality, for example, a ring shaped part having a coil shape, and the couple of power feeding parts penetrating the insulating body and fixed to the insulating body and respectively connected to both ends of the ring shaped part.

Fourth Embodiment

A configuration of a heater unit according to a fourth embodiment of the present invention will be described hereinafter with reference to the attached drawings.

(1) Configuration of Heater Unit

At the outside of the outer tube 12, the heater unit 30 as a heating device configured to heat the inside of the process tube 11 is installed in a manner of surrounding the outer tube 12. The heater unit 30 includes the heating elements 42 having a ring shape, the insulating body 33 surrounding the outer circumferences of the heating elements 42, the couple of power feeding parts 45 and 46 as a fixation part connected respectively to both ends of the heating elements 42, and the case 31 surrounding the outer side of the insulating body 33.

One or more heating elements 42 are vertically installed in the manner of surrounding the outer tube 12. As shown in FIG. 2 and FIG. 3, the heating elements 42 each includes a ring shape in the manner of surrounding the outer circumference of the outer tube 12. Both end parts of the heating element 42 are fixed in a state where they are close to each other without contact, and are in electrically non-contact with each other. That is, the heating element 42 is configured to electrically have an imperfect circular shape, for example, a C-shaped ring shape. As a material constituting the heating element 42, a resistance heating material, for example, such as Fe—Cr—Al alloy, $MOSi_2$, and SiC may be used, and the shape of the material may be a line shape as shown in FIG. 4A, or be a plate shape as shown in FIG. 4B. As shown in FIG. 2, FIG. 3, and FIG. 5, respectively at the upper and lower ends of the heating element 42, the mountain part (protrusion part) 42a and the valley part (cutout part) 42b are alternately connected in plurality. That is, the heating element 42 has a meander shape (wave shape).

Both the end parts of the heating element 42 are connected with the end parts of the couple of power feeding parts 45 and 46, respectively. The couple of power feeding parts 45 and 46 penetrate the insulating body 33 (the side wall part 35) to be described later, and are fixed to the insulating body 33. That is, the couple of power feeding parts 45 and 46 function as a fixation part configured to fix the heating element 42 to the inner wall of the insulating body 33. FIG. 5A is a partial enlarged view (plan view) illustrating a fringe of the power feeding parts 45 and 46 viewed from the center side of the heating element 42 (viewed from the process tube 11). As such, the heating element 42 is fixed to only a single place (the end part of the heating element 42) by the couple of power feeding parts 45 and 46 as a fixation part. That is, except for the couple of power feeding parts 45 and 46, a fixing method using a holding body such as a pin is not used.

The couple of power feeding parts 45 and 46 are constituted by a conductive material such as metal. Through the couple of power feeding parts 45 and 46, by applying a current from one end of the heating element 42 to the other end, the heating element 42 is heated to increase the temperature in the process tube 11. The application of a current to the heating element 42 through the couple of power feeding parts 45 and 46 is controlled by the controller 280.

The insulating body 33 is installed to surround the outer circumference of the heating element 42. The insulating body 33 includes the side wall part 35 having a cylindrical shape with open upper and lower ends, and the top wall part 34 configured to cover the upper opening of the side wall part 35, so as to have a cylindrical shape with an open lower end. The insulating body 33 is installed coaxially with the outer tube 12. The side wall part 35 and the top wall part 34 is made of an insulating material, for example, such as alumina ($Al_2O_3$) or silica ($SiO_2$) having a fiber shape or a sphere shape. The side wall part 35 and the top wall part 34 each is integrally formed using a method, for example, such as a vacuum foam method. However, the side wall part 35 is not limited to the integrally forming, and thus, may be configured by stacking a plurality of circular insulating materials in a plurality of stages. According to the configuration as described above, when stress is added to the side wall part 35, breakage of the side wall part 35 can be suppressed, or maintenance performance can be improved.

The case 31 is installed in the manner of surrounding the outer circumference of the insulating body 33. For example, the case 31 has a cylindrical shape with a close upper end and an open lower end. For example, the case 31 is made of SUS (stainless steels prescribed in the Japanese Industrial Standard). The gap 32 between the outer circumferential surface of the insulating body 33 and the inner circumferential surface of the case 31 functions as a space for cooling air. The exhaust port penetrating the top wall part 34 and the top wall of the case 31 may be provided to forcibly cool the atmosphere between the insulating body 33 and the outer tube 12.

When being heated, the heating element 42 tends to grow along the circumferential direction or the radial direction by thermal expansion. As a result, the heating element 42 may contact and interfere with the inner wall of the insulating body 33. Especially, as in the current embodiment, when the heating element 42 has a meander shape, a growth amount increases, and a contact easily occurs. When the heating element 42 contacts and interferes with the inner wall of the insulating body 33, a local temperature increase (abnormal temperature increase) of the heating element 42 occurs to melt down the heating element 42. In addition, stress is added to the heating element 42 or the insulating body 33, and the heating element 42 or the insulating body 33 may be deformed. In addition, when, due to the extension along the radial direction of the heating element 42, the distance between the heating element 42 and the inner wall of the insulating body 33 is uneven along the circumferential direction of the heating element 42, uniformity in temperature distribution of the heating element 42 may be degraded along the circumferential direction, quality in processing a substrate may be decreased. That is, the temperature of the heating element 42 may abnormally increase at a place where the heating element 42 is close to the inner wall of the insulating body 33, or the temperature of the heating element 42 may decrease at a place where the heating element 42 is distant from the inner wall of the insulating body 33

Therefore, in the current embodiment, at least when the heating element 42 is disposed at a room temperature, the distance between the heating element 42 and the inner wall of the insulating body 33 increases as it goes away from the power feeding parts 45 and 46 as a fixation part, thereby solving the above-described problem. FIG. 6 is a horizontal cross-sectional view illustrating the heater unit 30 before temperature is increased (in a room temperature), according to the current embodiment. As shown in FIG. 6, at least when the heating element 42 is at a room temperature, the distance between the heating element 42 and the inner wall of the insulating body 33 gradually increases as it goes away from the couple of power feeding parts 45 and 46, and thus, distances A, B, and C of FIG. 6 have a relationship of A<B<C).

In this state, when the temperature of the heating element 42 is increased, for example, up to a temperature while a substrate is processed, each part of the heating element 42 expands in the directions as shown in FIG. 8 by thermal expansion. FIG. 8 is a schematic view illustrating directions and lengths of arrows as displacement directions and displacement amounts respectively of parts of the heating element 42. Since the heating element 42 is fixed to a single place by the couple of power feeding parts 45 and 46, each part of the heating element 42 has a deviation in a manner of swelling outward from, as a starting point, a region (a region indicated by a symbol A1) adjacent to the couple of power feeding parts 45 and 46 (in a manner of going away from the couple of power feeding parts 45 and 46). A deviation amount of the heating element 42 increases as it goes away from the couple of power feeding parts 45 and 46.

As a result, at least when the heating element 42 is at a substrate process temperature, the distances between the heating element 42 and the inner wall of the insulating body 33 are identical along the circumferential direction of the heating element 42. FIG. 7 is a horizontal cross-sectional view illustrating the heater unit 30 after temperature is increased (in a substrate process temperature), according to the current embodiment. As shown in FIG. 7, at least when the heating element 42 is at a substrate process temperature, the distances between the heating element 42 and the inner wall of the insulating body 33 are identical along the circumferential direction of the heating element 42 by thermal expansion, and thus, distances A, B, and C of FIG. 7 have a relationship of A≈B≈C.

(2) Substrate Processing Process

A substrate processing process of the current embodiment is the same as that of the first embodiment.

(3) Effects Relevant to the Current Embodiment

According to the current embodiment, at least one of effects (a) to (c) is attained as follows.

(a) According to the current embodiment, at least when the heating element 42 is at a room temperature, the distance between the heating element 42 and the inner wall of the insulating body 33 gradually increases as it goes away from the couple of power feeding parts 45 and 46 as a fixation part. As a result, when the heating element 42 is at a substrate process temperature, the distances between the heating element 42 and the inner wall of the insulating body 33 are identical along the circumferential direction of the heating element 42 by thermal expansion. Thus, unnecessary contact and interference between the heating element 42 and the inner wall of the insulating body 33 can be prevented. In addition, a damage of components of the heater unit 30 can be suppressed. For example, a local temperature increase (abnormal temperature increase) of the heating element 42 can be prevented, and meltdown of the heating element 42 can be prevented. In addition, for example, since there is no contact between the heating element 42 and the inner wall of the insulating body 33, stress added to members of the heating element 42 and the insulating body 33 can be reduced.

(b) According to the current embodiment, at least when the heating element 42 is at a substrate process temperature, the distances between the heating element 42 and the inner wall of the insulating body 33 are identical along the circumferential direction of the heating element 42 by thermal expansion. As a result, a wafer 1 can be uniformly heated along the circumferential direction of the heating element 42. As a result, in-surface uniformity in processing a substrate can be improved.

(c) According to the current embodiment, the heating element 42 is fixed to only a single place (end part) by the couple of power feeding parts 45 and 46 as a fixation part. That is, except for the couple of power feeding parts 45 and 46, a fixing method using a holding body such as a pin is not used. As a result, a damage or a short circuit of the heating element 42 due to thermal expansion can be suppressed. That is, the heating element 42 according to the current embodiment is not confined at a part except for a connection place to the power feeding parts 45 and 46, and the thermal expansion of the heating element 42 is not suppressed, stress added to the heating element 42 or the holding body can be reduced, and thus, a deformation, a damage, and a short circuit of the heating element 42 can be suppressed.

For reference, in a case where a heating element 42' and an inner wall of an insulating body 33' have concentric circles at a room temperature, thermal deformation of the heating element 42' will now be described with reference to FIG. 16A and FIG. 16B.

FIG. 16A illustrates a state before the temperature of the heating element 42' is increased, and FIG. 16B illustrates a state after the temperature of the heating element 42' is increased. As shown in FIG. 16A, before temperature is increased, the distance between the heating element 42' and the inner wall of the insulating body 33' is uniform along the entire circumference of the heating element 42'. However, as shown in FIG. 16B, when the temperature of the heating element 42' is increased, for example, up to a substrate process temperature, the heating element 42' is extended along the diameter of the heating element 42', and the distance between the heating element 42' and the inner wall of the insulating body 33' is uneven along the circumferential direction of the heating element 42' (distances A, B, and C of FIG. 16B are in a state of A>B>C). That is, since a couple of power feeding parts 45' and 46' are fixed to the insulating body 33', each portion of the heating element 42' expands from a region close to the couple of power feeding parts 45' and 46', as a base point. In addition, the distance between the heating element 42' and the inner wall of the insulating body 33' gradually decreases as it goes away from the couple of power feeding parts 45' and 46', and the heating element 42' contacts the inner wall of the insulating body 33' in a region farthest from the couple of power feeding parts 45' and 46'. As a result, a local temperature increase (abnormal temperature increase) of the heating element 42' may occur to melt down the heating element 42'. In addition, stress added to the heating element 42' may increase, and members of the heating element 42' may be damaged. In addition, uniformity in temperature distribution of the heating element 42' may be degraded.

In addition, for reference, a state where the heating element 42' is fixed to each inner wall of the insulating element by the plurality of holding bodies 41' and a displacement of each part of the heating element 42' due to thermal expansion is confined will be described with reference to FIG. 17.

FIG. 17A is a schematic view illustrating a state before the temperature of the heating element 42' is increased. Respectively at the upper and lower ends of the heating element 42', a mountain part 42a' and a valley part 42b' are alternately connected in plurality, in which the heating element 42' has a meander shape (wave shape). 42R' The respective valley parts 42b' are independently fixed to an inner circumferential side wall of an insulating body (not shown) by the holding bodies 41', so that the heating element 42' is held to the inner circumferential side of the insulating body. The holding bodies 41' are directly disposed in the valley parts 42b'. FIG. 17B is a schematic view illustrating the heating element 42' after temperature is increased. As described above, the heating element 42' having a meander shape is grown along the circumferential direction by thermal expansion. FIG. 17B is a schematic view illustrating a state where a growth amount along the circumferential direction of the heating element 42' is greater than a predetermined amount, so that a movement value along the circumferential direction of the heating element 42' is zero (the holding body 41' interferes with the heating element 42'). The heating element 42' is further grown to be in the state shown in FIG. 17C. FIG. 17C is a schematic view illustrating a state where shearing of the holding body 41', a split of the heating element 42', and a short circuit of the heating element 42' are caused by thermal deformation. As described above, when a growth amount along the circumferential direction is greater than a predetermined amount, the holding body 41' interferes with the heating element 42', and plastic stress is added to the heating element 42', so that the heating element 42' is deformed. In a region A3, the holding body 41' is fitted into both sides of the valley part 42b' and sheared. In a region A4, the heating element 42' is split. In a region A5, a short circuit occurs at the heating element 42'.

FIG. 17D is a side view illustrating the heating element 42' shown in FIG. 17C, and missing of the holding body 41' due to thermal deformation. In a region A6, due to the deformation of the heating element 42', the holding body 41' is pulled from the insulating body just before removal.

Fifth Embodiment

A fifth embodiment of the present invention will be described hereinafter with reference to the attached drawings.

In the current embodiment, a plurality of fixation parts are installed, not a single fixation part. That is, the heating element 42 uses the couple of power feeding parts 45 and 46 as a fixation part and dummy terminals 45d and 46d as another fixation part, and is fixed to a plurality of places (two places in the current embodiment). In addition, the couple of power feeding parts 45 and 46 and the couple of dummy terminals 45d and 46d approximately bisects the heating element 42 along the circumferential direction.

Figure 10B:
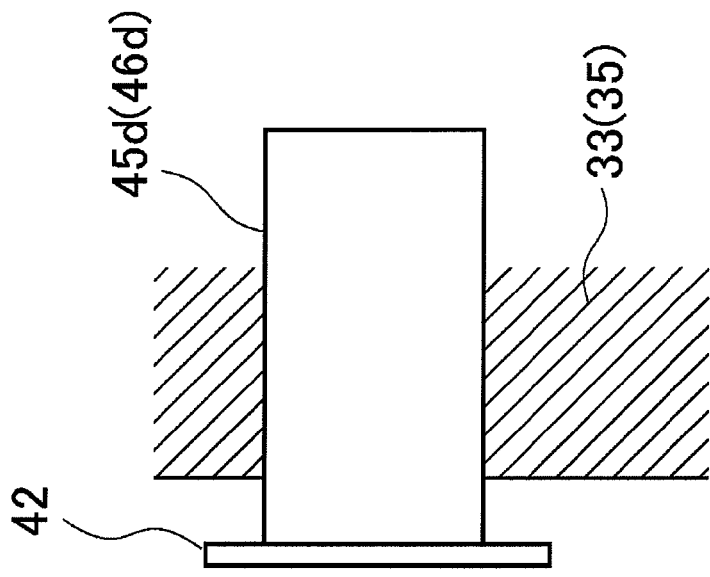
FIG. 10B is a side view illustrating an enlarged part of FIG. 10A.
Figure 10A:
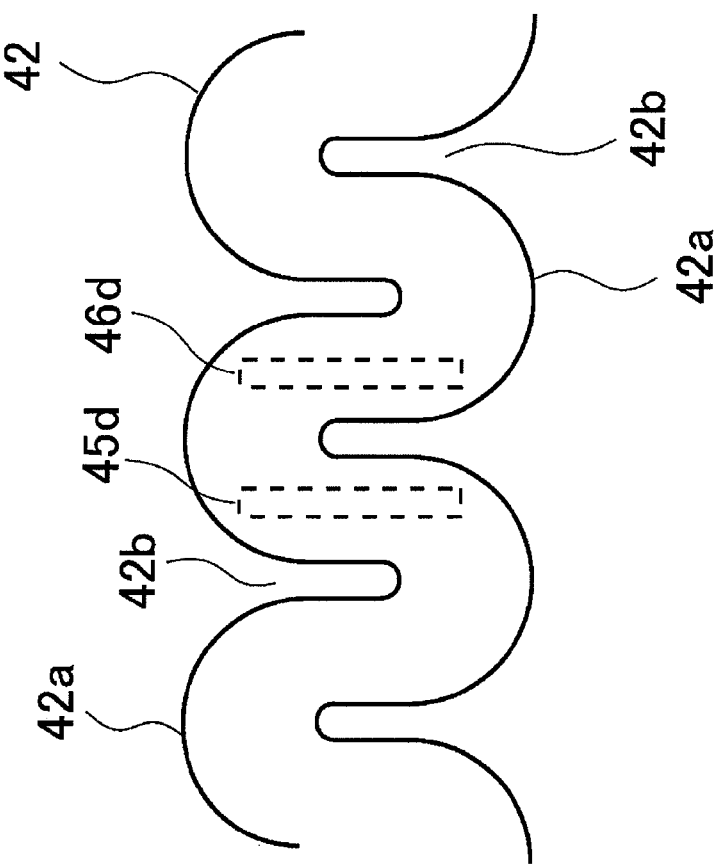
FIG. 10A is a partial enlarged view illustrating a periphery of dummy terminals according to a second embodiment of the present invention.

FIG. 10A is a partial enlarged view illustrating a periphery of the dummy terminals 45d and 46d as a fixation part according to the current embodiment, and FIG. 10B is a side view illustrating an enlarged part. The couple of dummy terminals 45d and 46d are connected to an end part of the heating element 42 (to the opposite side of the connection place to the power feeding parts 45 and 46), and are fixed to the insulating body 33 by passing through the insulating body 33 (the side wall part 35).

That is, the couple of dummy terminals 45d and 46d, in the same manner of the couple of power feeding parts 45 and 46, function as a fixation part configured to fix the heating element 42 to the inner wall of the insulating body 33. In addition, the dummy terminals 45d and 46d, in the same manner of the power feeding parts 45 and 46, are constituted by a conductive material such as a metal. Through the couple of dummy terminals 45d and 46d, by applying a current from one end of the heating element 42 to the other end of the heating element 42, the heating element 42 is heated to increase the temperature in the process tube 11. In addition, the application of a current to the heating element 42 through the couple of power feeding parts 45 and 46 is controlled by the controller 280. In addition, the dummy terminals 45d and 46d may be configured such that power is not supplied thereto. In this case, the dummy terminals 45d and 46d may not be made of a conductive material, and thus, may be made of a heat-resisting insulating material.

In addition, in the current embodiment, at least when the heating element 42 is at a room temperature, the distance between the heating element 42 and the inner wall of the insulating body 33 is set to be maximum at center positions between the adjacent fixation parts, and set to be decreased as it closes from the center positions to the fixation part (the couple of power feeding parts 45 and 46 or the couple of dummy terminals 45d and 46d).

Figure 12:
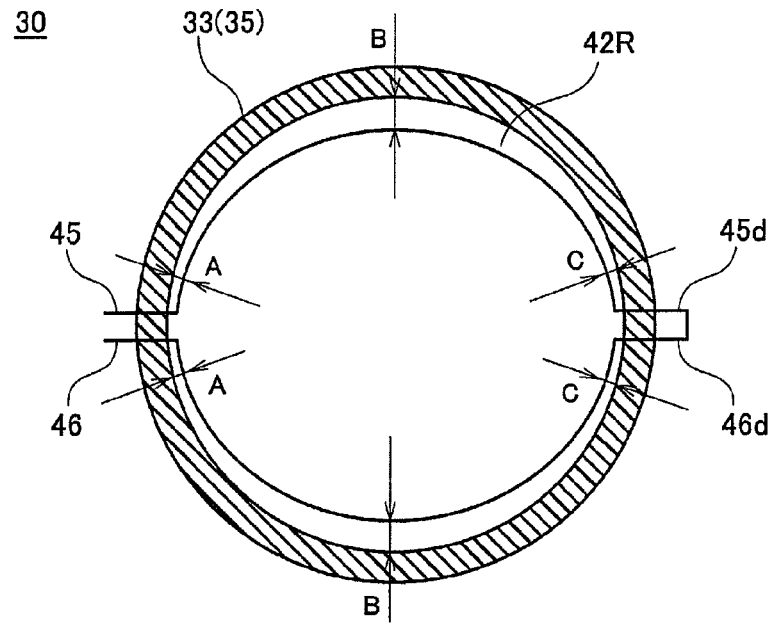
FIG. 12 is a horizontal cross-sectional view illustrating a heater unit before temperature is increased, according to a third embodiment of the present invention.

FIG. 12 is a horizontal cross-sectional view illustrating the heater unit 30 before temperature is increased, according to the current embodiment. Referring to FIG. 12, each distance (B in FIG. 12) between the heating element 42 and the inner wall of the insulating body 33 is maximum at center positions between the couple of power feeding parts 45 and 46 and the couple of dummy terminals 45d and 46d. In addition, the distance between the heating element 42 and the inner wall of the insulating body 33 gradually decreases as it closes from the center positions to the couple of power feeding parts 45 and 46 or the couple of dummy terminals 45d and 46d. That is, B>A and B>C in FIG. 12.

Figure 14:
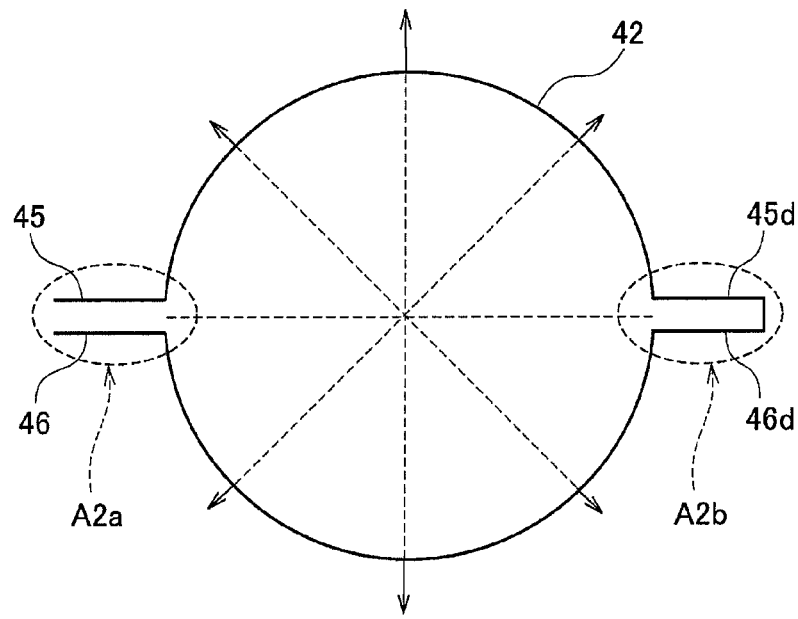
FIG. 14 is a schematic view illustrating expansion directions of a heating element according to the third embodiment of the present invention.

In this state, when the temperature of the heating element 42 is increased, for example, up to a temperature while a substrate is processed, each part of the heating element 42 expands in directions as shown in FIG. 14 by thermal expansion. FIG. 14 is a schematic view illustrating directions and lengths of arrows as displacement directions and displacement amounts respectively of parts of the heating element 42. Since the heating element 42 is fixed to two places by the couple of power feeding parts 45 and 46 and the couple of dummy terminals 45d and 46d, each part of the heating element 42 has a deviation in a manner of swelling outward (that is, extending upward and downward in FIG. 14 from, respectively as starting points, a region (region denoted by A2a) near the couple of power feeding parts 45 and 46, and a region (region denoted by A2b) near the couple of dummy terminals 45d and 46d. A deviation amount of the heating element 42 increases as it closes to the center positions (the upper and lower ends in FIG. 14) between the couple of power feeding parts 45 and 46 and the couple of dummy terminals 45d and 46d, and is maximum just at the center positions.

Figure 13:
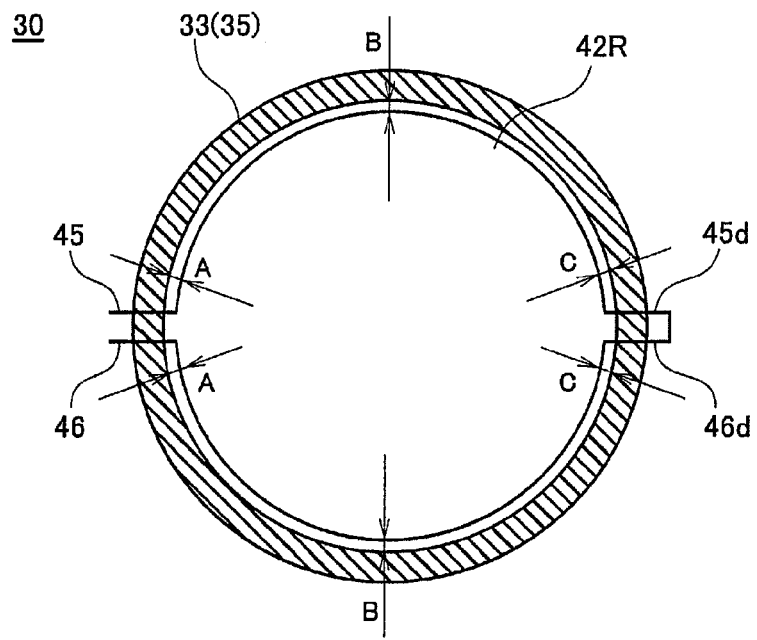
FIG. 13 is a horizontal cross-sectional view illustrating the heater unit after temperature is increased, according to the third embodiment of the present invention.

As a result, at least when the heating element 42 is at a substrate process temperature, the distances between the heating element 42 and the inner wall of the insulating body 33 are identical along the circumferential direction of the heating element 42. FIG. 13 is a horizontal cross-sectional view illustrating the heater unit 30 after temperature is increased (that is, at a substrate process temperature), according to the current embodiment. Referring to FIG. 13, at least when the heating element 42 is at a substrate process temperature, the distances between the heating element 42 and the inner wall of the insulating body 33 are identical along the circumferential direction of the heating element 42 by thermal expansion, and distances A, B, and C of FIG. 13 have a relationship of A≈B≈C.

In the current embodiment, aside from the effects of the fourth embodiment, at least one of effects (a) to (c) is attained as follows.

(a) According to the current embodiment, the maximum displacement amount of the heating element 42 can be decreased. As a result, a contact between the heating element 42 and the insulating body 33 can be prevented more reliably.

Figure 15:
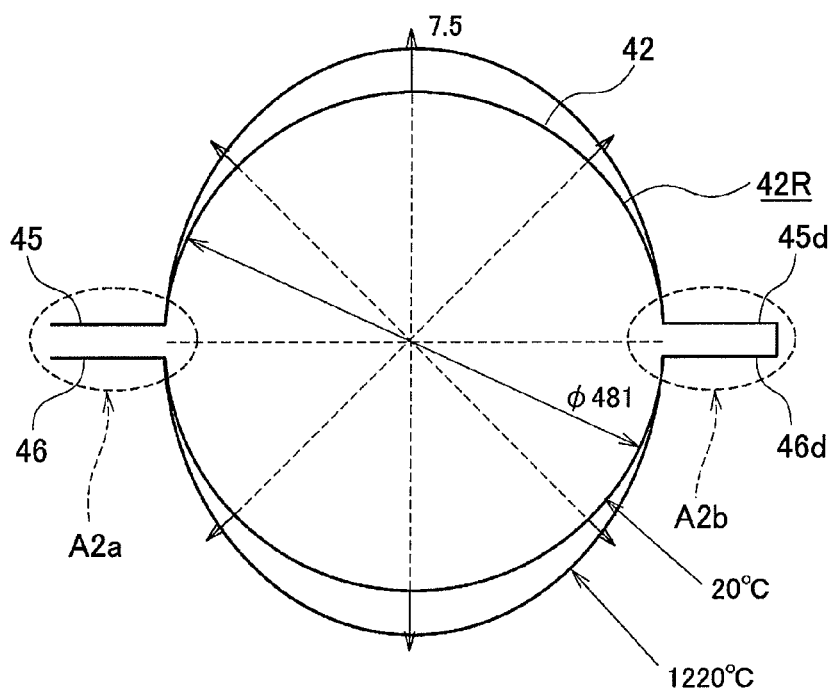
FIG. 15 is a schematic view illustrating the result of measurement relevant to thermal expansion of the heating element according to the third embodiment of the present invention.

FIG. 9 is a schematic view illustrating the result of measurement relevant to thermal expansion of a heating element according to the fourth embodiment, and FIG. 15 is a schematic view illustrating the result of measurement relevant to thermal expansion of the heating element 42 according to the fifth embodiment. In each evaluation shown in FIG. 9 and FIG. 15, the heating element 42 with a ring shape having a diameter φ of 481 mm at a room temperature of 20° C. was heated up to a substrate process temperature of 1220° C. to measure a displacement amount of each part of the heating element 42. In addition, the heating element 42 has a meander shape using Kanthal APM (registered trade mark), which has a coefficient of linear expansion of $15 \times 10^{-6}$ at a temperature ranging from 20° C. to 1250° C. Diameter growth amount of the heating element 42 due to the temperature increase= (Length of the heating element 42)×(1250−20)×$15 \times 10^{-6}$ mm.

As a result, the diameter φ of the heating element 42 in the fourth embodiment increased from 481 mm to 490.2 mm. In addition, referring to FIG. 9, position deviation amounts respectively of portions of the heating element 42 gradually increased as it went away from the couple of power feeding parts 45 and 46 (were 3.8 mm, 6.5 mm, and 8.6 mm from the region A1 as a base point), and the farthest portion from the couple of power feeding parts 45 and 46 had the maximum 9.2 mm. At the farthest place from the couple of power feeding parts 45 and 46, a position deviation along the circumferential direction (tangential direction) almost does not occur, and a position deviation along only the radial direction occurs.

In response, each part of the heating element 42 according to the fifth embodiment gradually increased as it went away from the fixation part (the couple of power feeding parts 45 and 46 or the couple of dummy terminals 45d and 46d), and the part disposed at the center positions between the adjacent fixation parts (at the center positions between the couple of power feeding parts 45 and 46 or the couple of dummy terminals 45d and 46d) had a maximum of 7.5 mm. That is, according to the present embodiment, the maximum displacement amount of the heating element 42 can be smaller than that of the fourth embodiment by about 20%. In addition, at the center position having the maximum displacement amount, a position deviation along the radial direction occurred principally, without a position deviation along the circumferential direction (tangential direction).

(b) According to the current embodiment, the connection place to the couple of power feeding parts 45 and 46 is fixed, and the opposite side thereof is also fixed with the couple of dummy terminals 45d and 46d. Thus, a displacement direction of each part of the heating element 42, as shown in FIG. 14, can be approximately coincident with the radial direction of the heating element 42 (the perpendicular direction to the inner wall of the insulating body 33). Especially, at the center position having the maximum displacement amount (at the center position between the couple of power feeding parts 45 and 46 and the couple of dummy terminals 45d and 46d), a position deviation along only the radial direction can occur, without a position deviation along the circumferential direction (tangential direction). As a result, even when a bridge-shaped or T-shaped pin member is additionally installed as a fixation part to this center position, contact and interference between the heating element 42 and the pin member due to thermal expansion can be suppressed. That is, according to the present embodiment, a deformation, a damage, and a short circuit of the heating element 42 can be suppressed, and, it is possible to increase holding strength for the heating element 42.

In addition, in the fourth embodiment without fixing the opposite side of the connection place to the power feeding parts 45 and 46, as shown in FIG. 8, for example, at a position displaced 90° from the couple of power feeding parts 45 and 46 (a position corresponding to the center position between the couple of power feeding parts 45 and 46 and the couple of dummy terminals 45d and 46d in the second embodiment), a displacement direction of the heating element 42 does not coincide with the radial direction of the heating element 42, and thus, slightly closes to the tangential direction. As a result, instead of fixing with the couple of dummy terminals 45d and 46d, if the above-described pin member is additionally installed at the position displaced 90° from the couple of power feeding parts 45 and 46, contact and interference between the heating element 42 and the pin member due to thermal expansion occur to cause defects such as a deformation, a damage, and a short circuit of the heating element 42.

(c) According to the current embodiment, to approximately coincide a displacement direction of each part of the heating element 42 with the radial direction of the heating element 42, for example, even when a bridge-shaped or T-shaped holding member is additionally installed as a fixation part to this center position, it is unnecessary to provide the heating element 42 with a cutout (stretch replacement hole) for preventing contact and interference between the heating element 42 and the holding member. Thus, a strength decrease of the heating element 42 or a decrease in the amount of heat generation of the heating element 42 can be prevented. In addition, without fixing with the couple of dummy terminals 45d and 46d, if the above-described pin member is installed at the position displaced 90° from the couple of power feeding parts 45 and 46, it is necessary to install a cutout to prevent contact and interference between the heating element 42 and the holding member, which may decrease the strength of the heating element 42 or decrease the amount of heat generation of the heating element 42.

Other Embodiments

While the embodiments of the present invention have been particularly described, various changes in form and details may be made without departing from the spirit and scope of the present invention.

For example, in the above-described embodiment, as a fixation part configured to fix the heating element 42 to the inner wall of the insulating body 33, the couple of power feeding parts 45 and 46 or the couple of dummy terminals 45d and 46d are exemplified, but the present invention is not limited thereto. That is, this member may not be provided in duplicate. In addition, for example, the pin member fixed to the inner wall of the insulating body 33 may be used as a fixation member. FIG. 11A is a partial enlarged view illustrating a periphery of a bridge-shaped pin member 45b as a modified example of a fixation member, and FIG. 11B is a side view illustrating an enlarged part. In addition, although not shown, a T-shaped pin member or an L-shaped pin member may be used as a fixation member.

In addition, for example, in the above-described embodiment, one or two places are provided to fix the heating element 42 through the fixation part, but the present invention is not limited thereto, and thus, for example, three or more places may be provided for fixing. Also in this case, at least when a heating element is at a room temperature, the distance between the heating element and the inner wall of an insulating body is set to be maximum at center positions between adjacent fixation parts, and set to be decreased as it closes from the center positions to the fixation part. As the number of fixation places is increased, it is possible to decrease the maximum displacement amount and to improve holding strength of the heating element 42. In addition, a plurality of fixation parts may be spaced the same distance from each other along the circumferential direction of the heating element 42.

In addition, in the above-described case, the plurality of fixation parts may be the same through-members such as the couple of power feeding parts 45 and 46 or the couple of dummy terminals 45d and 46d, or may be the same pin members such as the bridge-shaped pin member 45b, or may be combinations thereof.

In addition, for example, the present invention is not limited to the case where the mountain part (protrusion part) 42a and the valley part (cutout part) 42b are installed at the upper and lower ends of the heating element 42. That is, the shape of the heating element 42 is not limited to a meander shape (wave shape), and thus, may be an elongated shape.

The present invention is not limited to a semiconductor manufacturing apparatus, and thus, may be very suitably applicable even to an apparatus configured to process a glass substrate such as a liquid crystal display (LCD) device. In addition, the configuration of the process chamber is not limited to the above-described embodiments. That is, regardless of a detailed description of a substrate process, the substrate process may be any process such as an anneal process, an oxidization process, a nitridation process, and a diffusion process as well as a film forming process. In addition, for example, a film forming process may be a chemical vapor deposition (CVD) process, a physical vapor deposition (PVD) process, an oxide film forming process, a nitride film forming process, or a metal-containing film forming process. In addition, the substrate process may be an exposure process performed using photolithography, or a resist liquid application process or etching liquid application process.

The heating device, the substrate processing apparatus, and the method of manufacturing a semiconductor device according to the present invention can suppress the differences between the heating elements, and simultaneously, can suppress shearing of the holder due to thermal deformation of the heating elements, and simultaneously, can suppress a contact between the heating element and the insulating body when the heating element thermally expands, and can reduce a damage of components of the heating device.

While the embodiments of the present invention have been particularly described, various changes in form and details may be made without departing from the spirit and scope of the present invention.

Preferred Embodiments of the Present Invention

The present invention also includes the following embodiments.

(Supplementary Note 1)

According to a preferred embodiment of the present invention, there is provided a heating device comprising:

a heating element including a mountain part and a valley part that are alternately connected in plurality in a meander shape with both ends being fixed;

holding body receiving parts respectively installed at ends of the valley parts and formed as cutout parts having a width larger than a width of the valley part;

an insulating body installed at an outer circumference of the heating element; and a holding body disposed in the holding body receiving part and fixed to the insulating body.

Preferably, the holding body receiving part may be formed as a cutout part having a circular shape with a diameter larger than a width of the valley part.

Preferably, the heating element may comprise:

a ring shaped part formed at a place where the mountain part and the valley part are alternately connected in plurality; and a couple of power feeding parts penetrating the insulating body and fixed to the insulating body and respectively connected to both ends of the ring shaped part, wherein a width of the holding body receiving part may be set to increase as the holding body receiving part goes away from the power feeding parts.

Preferably, the heating element may comprise:

a ring shaped part formed at a place where the mountain part and the valley part are alternately connected in plurality; and a couple of power feeding parts penetrating the insulating body and fixed to the insulating body and respectively connected to both ends of the ring shaped part, wherein a relative position between the holding body receiving part and the holding body may be set to be varied in at least one portion of parts respectively constituting an entire circumference of the ring shaped part.

(Supplementary Note 2)

In the heating device of Supplementary Note 1, the heating element may comprise a ring shaped part formed at a place where the mountain part and the valley part are alternately connected in plurality, and a couple of power feeding parts penetrating the insulating body and fixed to the insulating body and respectively connected to both ends of the ring shaped part;

the insulating body may comprise a storage part in an inner circumferential surface of the insulating body, and the storage part may have a tube shape in a manner of surrounding an outer circumferential surface of the ring shaped part, and may have a groove shape receiving the ring shaped part;

front ends of the mountain parts of the ring shaped part may be inclined respectively at obtuse angles from a middle part except for the front ends of the mountain parts of the ring shaped part such that the front ends of the mountain parts of the ring shaped part are directed to a center of the ring shaped part;

both side walls of the storage part may be inclined respectively at obtuse angles from a bottom surface of the storage part; and the angles at which the front ends of the mountain parts may be inclined and the angles at which both the side walls of the storage part are inclined may be set to be identical.

Preferably, the bottom surface of the storage part may have a width larger than that of the middle part, and the heating device may comprise a stepped part having a width less than that of the middle part, in the bottom surface of the storage part.

(Supplementary Note 3)

In the heating device of Supplementary Note 1, the heating element may comprise a ring shaped part formed at a place where the mountain part and the valley part are alternately connected in plurality, and a couple of power feeding parts penetrating the insulating body and fixed to the insulating body and respectively connected to both ends of the ring shaped part;

the insulating body may comprise a storage part in an inner circumferential surface of the insulating body, and the storage part may be formed in a tube shape in a manner of surrounding an outer circumferential surface of the ring shaped part, and may have a groove shape receiving the ring shaped part; and a distance between a bottom surface of the storage part and a middle part except for front ends of the mountain part of the ring shape part adjacent to the bottom surface may be set to be varied in at least one portion of parts respectively constituting entire circumferences of the storage part and the ring shaped part.

Preferably, at least when the ring shaped part is at a room temperature, the distance may be set to be varied in at least one portion of the parts respectively constituting the entire circumferences of the storage part and the ring shaped part.

Preferably, at least when the ring shaped part is at a substrate process temperature, the distance may be set to be identical at the parts respectively constituting the entire circumferences of the storage part and the ring shaped part by thermal expansion.

Preferably, the distance may be set to increase as it goes away from the couple of power feeding parts.

(Supplementary Note 4)

According to another preferred embodiment of the present invention, there is provided a substrate processing apparatus comprising:

a heating device that comprises a heating element including a mountain part and a valley part that are alternately connected in plurality in a meander shape with both ends being fixed, holding body receiving parts respectively installed at ends of the valley parts and formed as cutout parts having a width larger than a width of the valley part, an insulating body installed at an outer circumference of the heating element, and a holding body disposed in the holding body receiving part and fixed to the insulating body; and a process chamber installed in the heating device and processing a substrate.

Preferably, the holding body receiving part may be formed as a cutout part having a circular shape with a diameter larger than the width of the valley part.

Preferably, the heating element may comprise:

a ring shaped part formed at a place where the mountain part and the valley part are alternately connected in plurality; and a couple of power feeding parts penetrating the insulating body and fixed to the insulating body and respectively connected to both ends of the ring shaped part;

wherein a width of the holding body receiving part may be set to increase as it goes away from the couple of power feeding parts.

Preferably, the heating element may comprise a ring shaped part formed at a place where the mountain part and the valley part are alternately connected in plurality, and a couple of power feeding parts penetrating the insulating body and fixed to the insulating body and respectively connected to both ends of the ring shaped part;

the insulating body may comprise a storage part in an inner circumferential surface of the insulating body, and the storage part may have a tube shape in a manner of surrounding an outer circumferential surface of the ring shaped part, and may have a groove shape receiving the ring shaped part;

front ends of the mountain parts of the ring shaped part may be inclined respectively at obtuse angles from a middle part except for the front ends of the mountain parts of the ring shaped part such that the front ends of the mountain parts of the ring shaped part are directed to a center of the ring shaped part;

both side walls of the storage part may be inclined respectively at obtuse angles from a bottom surface of the storage part; and the angles at which the front ends of the mountain parts may be inclined and the angles at which both the side walls of the storage part are inclined may be set to be identical.

Preferably, the bottom surface of the storage part may have a width larger than that of the middle part except for the front ends of the mountain parts of the ring shaped part, and the heating device may comprise a stepped part having a width less than that of the middle part, in the bottom surface of the storage part.

Preferably, the heating element may comprise a ring shaped part formed at a place where the mountain part and the valley part are alternately connected in plurality, and a couple of power feeding parts penetrating the insulating body and fixed to the insulating body and respectively connected to both ends of the ring shaped part, the insulating body may comprise a storage part in an inner circumferential surface of the insulating body, and the storage part may be formed in a tube shape in a manner of surrounding an outer circumferential surface of the ring shaped part, and may have a groove shape receiving the ring shaped part; and a distance between a bottom surface of the storage part and a middle part except for front ends of the mountain part of the ring shape part adjacent to the bottom surface may be set to be varied in at least one portion of parts respectively constituting entire circumferences of the storage part and the ring shaped part.

Preferably, at least when the ring shaped part is at a room temperature, the distance may be set to be varied in at least one portion of the parts respectively constituting the entire circumferences of the storage part and the ring shaped part.

Preferably, at least when the ring shaped part is at a substrate process temperature, the distance may be set to be identical at the parts respectively constituting the entire circumferences of the storage part and the ring shaped part by thermal expansion.

Preferably, the distance may be set to increase as it goes away from the couple of power feeding parts.

(Supplementary Note 5)

According to another preferred embodiment of the present invention, there is provided a method of manufacturing a semiconductor device, the method comprising:

loading a substrate into a process chamber installed in a heating device; and increasing temperature of a heating element provided to the heating device to heat the substrate in the process chamber in a state where both ends of the heating element including a mountain part and a valley part that are alternately connected in plurality in a meander shape are fixed to an insulating body installed at an outer circumference of the heating element, and simultaneously, holding bodies are disposed in holding body receiving parts respectively installed at ends of the valley parts and formed as cutout parts having a width larger than a width of the valley part, and are fixed to the insulating body, so as to hold a position of the heating element.

According to another preferred embodiment of the present invention, there is provided a heating device comprising:

a heating element including a ring shaped part formed at a place where a mountain part and a valley part are alternately connected in plurality; and an insulating body including a storage part in an inner circumferential surface of the insulating body, and the storage part has a tube shape in a manner of surrounding an outer circumferential surface of the ring shaped part, and has a groove shape receiving the ring shaped part, wherein the heating element includes a couple of power feeding parts penetrating the insulating body and fixed to the insulating body and respectively connected to both ends of the ring shaped part, front ends of the mountain parts of the ring shaped part is inclined respectively at obtuse angles from a middle part except for the front ends of the mountain parts of the ring shaped part such that the front ends of the mountain parts of the ring shaped part are directed to a center of the ring shaped part, both side walls of the storage part are inclined respectively at obtuse angles from a bottom surface of the storage part, and the angles at which the front ends of the mountain parts are inclined and the angles at which both the side walls of the storage part are inclined are set to be identical.

Preferably, the bottom surface of the storage part may have a width larger than that of the middle part, and the heating device may comprise a stepped part having a width less than that of the middle part, in the bottom surface of the storage part.

According to another preferred embodiment of the present invention, there is provided a heating device comprising:

a heating element including a ring shaped part formed at a place where a mountain part and a valley part are alternately connected in plurality; and an insulating body including a storage part in an inner circumferential surface of the insulating body, and the storage part has a tube shape in a manner of surrounding an outer circumferential surface of the ring shaped part, and has a groove shape receiving the ring shaped part, wherein the heating element includes a couple of power feeding parts penetrating the insulating body and fixed to the insulating body and respectively connected to both ends of the ring shaped part, and a distance between a bottom surface of the storage part and a middle part except for front ends of the mountain part of the ring shape part adjacent to the bottom surface is set to be varied in at least one portion of parts respectively constituting entire circumferences of the storage part and the ring shaped part.

Preferably, at least when the ring shaped part is at a room temperature, the distance may be set to be varied in at least one portion of the parts respectively constituting the entire circumferences of the storage part and the ring shaped part.

Preferably, at least when the ring shaped part is at a substrate process temperature, the distance may be set to be identical at the parts respectively constituting the entire circumferences of the storage part and the ring shaped part by thermal expansion.

(Supplementary Note 6)

According to another preferred embodiment of the present invention, there is provided a heating device comprising:

a heating element having a ring shape;

an insulating body installed in a manner of surrounding an outer circumference of the heating element; and a fixation part configured to fix the heating element to an inner wall of the insulating body, wherein, at least when the heating element is at a room temperature, a distance between the heating element and the inner wall of the insulating body is set to be increased as it goes away from the fixation part.

Preferably, the fixation part may be installed in plurality along a circumferential direction of the heating element, and at least when the heating element is at the room temperature, the distance between the heating element and the inner wall of the insulating body may be set to be decreased as it closes to the fixation part from a center position between the adjacent fixation parts.

Preferably, at least when the heating element is at the room temperature, the distance between the heating element and the inner wall of the insulating body may be set to be maximum at the center position between the adjacent fixation parts.

Preferably, at least when the heating element is at a heating process temperature, the distance between the heating element and the inner wall of the insulating body may be set to be identical along the circumferential direction of the heating element.

Preferably, the plurality of fixation parts may be spaced the same distance from each other along the circumferential direction of the heating element.

Preferably, at least one of the fixation parts may be configured as a couple of power feeding parts, which pass through the insulating body, are fixed to the insulating body, and are connected respectively to both ends of the heating element.

Preferably, at least one of the fixation parts may be configured as a through-member that passes through the insulating body and is fixed to the insulating body.

Preferably, at least one of the fixation parts may be configured as a pin member that is fixed to the inner wall of the insulating body.

According to another preferred embodiment of the present invention, there is provided a method of manufacturing a semiconductor device, the method comprising: loading a substrate into a process chamber installed at an inside of a heating element in a heating device, the heating device including: the heating element having a ring shape; an insulating body installed in a manner of surrounding an outer circumference of the heating element; and a fixation part configured to fix the heating element to an inner wall of the insulating body; and increasing temperature of the heating element to heat the substrate in the process chamber and process the substrate, wherein, at least when the heating element is at a room temperature, a distance between the heating element and the inner wall of the insulating body is set to be increased as it goes away from the fixation part.

What is claimed is:

1. A heating device comprising:
a heating element having two ends, the heating element including a plurality of mountain parts and a plurality of valley parts alternately connected to form a meander shape, and a holding body receiving part at an end of a valley part of the plurality of valley parts, wherein a width of the holding body receiving part is greater than that of the valley part;
an insulating body installed at an outer circumference of the heating element with the two ends of the heating element fixed thereto; and a staple pin penetrating the holding body receiving part and a neighboring holding body receiving part to fix the heating element to the insulating body,
wherein the staple pin is dislocated with respect to a center of the holding body receiving part and an amount of dislocation of the staple pin with respect to the center of the holding body varies according to a distance between the holding body receiving part and the two ends,
wherein the insulating body comprises a storage part having a groove on a surface facing a surface of an object being heated, the storage part accommodating therein a mountain part of the plurality of mountain parts and the valley part,
wherein a distance between a bottom surface of the storage part and the mountain part and the valley part adjacent to the bottom surface is set according to the distance between the holding body receiving part and the two ends, and wherein the distance between the bottom surface of the storage part and the mountain part and the valley part is identical for each of the plurality of mountain parts and the valley parts when the heating element is at a substrate processing temperature.

2. The heating device of claim 1,
wherein a front end of the mountain part is inclined in a direction different from a meandering direction of the mountain part and the valley part.

3. The heating device of claim 1, wherein the width of the holding body receiving part increases as the distance between the holding body receiving part and the two ends increases.

4. The heating device of claim 1, wherein the amount of dislocation increases and then decreases as the distance between the holding body receiving part and the two ends increases.

5. The heating device of claim 1,
wherein the heating element has a ring shape and comprises a dummy terminal at an opposite side of the two ends to fix the heating element to the insulating body, and wherein a current flows from one end to the other end of the heating element via the dummy terminal.

6. The heating device of claim 1, wherein the storage part is disposed at an inner circumference surface of the insulating body, and the storage part includes sidewalls inclined at an obtuse angle with respect to a bottom surface of the storage part.

7. The heating device of claim 1, wherein the distance between the bottom surface of the storage part and each of the mountain part and the valley part varies in at least one portion of the heating element when the heating element is at a room temperature.

8. A substrate processing apparatus comprising:
a heating device comprising a heating element having two ends, the heating
element including a plurality of mountain parts and a plurality of valley parts alternately connected to form a meander shape and a holding body receiving part at an end of a valley part of the plurality of valley parts, wherein a width of the holding body receiving part is greater than that of the valley part;
an insulating body installed at an outer circumference of the heating element with two ends of the heating element fixed thereto;
a staple pin penetrating the holding body receiving part and a neighboring holding body receiving part to fix the heating element to the insulating body, wherein the staple pin is dislocated with respect to a center of the holding body receiving part and an amount of dislocation of the staple pin with respect to the center of the holding body varies according to a distance between the holding body receiving part and the two ends; and
a process chamber installed in the heating device to process the substrate,
wherein the insulating body comprises a storage part having a groove on a surface facing a surface of an object being heated, the storage part accommodating therein a mountain part of the plurality of mountain parts and the valley part,
wherein a distance between a bottom surface of the storage part and the mountain part and the valley part adjacent to the bottom surface is set according to the distance between the holding body receiving part and the two ends, and
wherein the distance between the bottom surface of the storage part and the mountain part and the valley part is identical for each of the plurality of mountain parts and the valley parts when the heating element is at a substrate processing temperature.

9. The heating device of claim 8, wherein the distance between the bottom surface of the storage part and each of the mountain part and the valley part varies in at least one portion of the heating element when the heating element is at a room temperature.

10. A heating device comprising:
a heating element having two ends, the heating element including a plurality of mountain parts consecutively connected to form a meander shape wherein each of the plurality of mountain parts has a cutout portion disposed at an inner curved portion thereof;
an insulating body installed at an outer circumference of the heating element; and
a holding body having a staple pin shape penetrating the cutout portion of one of the plurality of mountain parts and the cutout portion of a neighboring mountain part to fixedly attach the heating element to the insulating body,
wherein an amount of dislocation of the holding body penetrating the cutout portion at a first location of the heating element from a center of the cutout portion at the first location differs from an amount of dislocation of the holding body penetrating the cutout portion at a second location of the heating element from a center of the cutout portion at the second location, wherein the insulating body comprises a storage part having a groove on a surface facing a surface of an object being heated, the storage part accommodating therein a mountain part of the plurality of mountain parts and a valley part of a plurality of valley parts, wherein a distance between a bottom surface of the storage part and the mountain part and the valley part adjacent to the bottom surface is set according to a distance between the holding body receiving part and the two ends, and wherein the distance between the bottom surface of the storage part and the mountain part and the valley part is identical for each of the plurality of mountain parts and the valley parts when the heating element is at a substrate processing temperature.

11. The heating device of claim 10, wherein the distance between the bottom surface of the storage part and each of the mountain part and the valley part varies in at least one portion of the heating element when the heating element is at a room temperature.

* * * * *